United States Patent
Boroson

(10) Patent No.: US 7,316,756 B2
(45) Date of Patent: Jan. 8, 2008

(54) DESICCANT FOR TOP-EMITTING OLED

(75) Inventor: Michael L. Boroson, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 573 days.

(21) Appl. No.: 10/899,902

(22) Filed: Jul. 27, 2004

(65) Prior Publication Data

US 2006/0022592 A1  Feb. 2, 2006

(51) Int. Cl.
    C09J 5/02     (2006.01)
    B32B 38/16    (2006.01)
    B32B 43/00    (2006.01)
    C09K 11/06    (2006.01)
    C07C 49/92    (2006.01)
    C07F 5/06     (2006.01)
    C09K 17/40    (2006.01)
    H01L 21/316   (2006.01)

(52) U.S. Cl. .................. 156/108; 156/250; 156/307.3; 313/506; 313/512

(58) Field of Classification Search .................. 156/71, 156/108, 250, 307.1, 307.3; 252/301.16; 313/506, 512
See application file for complete search history.

(56) References Cited

U.S. PATENT DOCUMENTS

| | | | |
|---|---|---|---|
| 4,081,397 A | * | 3/1978 | Booe .......................... 252/194 |
| 4,769,292 A | | 9/1988 | Tang et al. |
| 4,885,211 A | | 12/1989 | Tang et al. |
| 5,882,761 A | | 3/1999 | Kawami et al. |
| 6,226,890 B1 | | 5/2001 | Boroson et al. |
| 6,470,594 B1 | | 10/2002 | Boroson et al. |
| 6,590,157 B2 | | 7/2003 | Boroson et al. |
| 6,594,916 B2 | | 7/2003 | Boroson et al. |
| 2003/0107314 A1 | | 6/2003 | Urabe et al. |
| 2003/0110981 A1 | | 6/2003 | Tsuruoka et al. |
| 2003/0127974 A1 | | 7/2003 | Miyazawa |
| 2003/0230978 A1 | | 12/2003 | Hishida |

FOREIGN PATENT DOCUMENTS

JP    2004-303643    10/2004

* cited by examiner

*Primary Examiner*—Philip Tucker
*Assistant Examiner*—Sing P. Chan
(74) *Attorney, Agent, or Firm*—Raymond L. Owens

(57) ABSTRACT

A method for reducing moisture contamination in a top-emitting OLED device includes providing a substrate having top and bottom surfaces; forming a top-emitting EL unit over the top surface of the substrate, wherein the EL unit produces light that is primarily not emitted through the substrate; forming first and second protective covers over the top and bottom surfaces of the substrate, respectively, and thereby defining first and second chambers, respectively; providing moisture-absorbing material in association with the second chamber; and providing communication between the first and second chambers whereby moisture in the first or second chambers is absorbed by the moisture-absorbing material.

72 Claims, 7 Drawing Sheets

DESICCANT FOR TOP-EMITTING OLED

CROSS REFERENCE TO RELATED APPLICATION

Reference is made to commonly assigned U.S. patent application Ser. No. 09/957,851, filed Sep. 21, 2001, entitled "Highly Moisture-Sensitive Eelectronic Device Element and Method for Fabrication" by Boroson et al. the disclosure of which is incorporated herein by reference.

FIELD OF THE INVENTION

The present invention relates to protecting OLED devices from moisture.

BACKGROUND OF THE INVENTION

An organic light-emitting diode device, also called an OLED device, commonly includes a substrate, an anode, a hole-transporting layer made of an organic compound, an organic luminescent layer with suitable dopants, an organic electron-transporting layer, and a cathode. OLED devices are attractive because of their low driving voltage, high luminance, wide-angle viewing and capability for full-color flat emission displays. Tang et al. described this multilayer OLED device in their U.S. Pat. Nos. 4,769,292 and 4,885,211.

In a bottom-emitting type of display where light is emitted downward through the substrate, the overall area that can emit light is limited by the presence on the substrate of circuitry such as Thin Film Transistors (TFT's), which are opaque. Consequently the open area available for the light to emerge is reduced. In top-emitting device structures where the light is made to emerge primarily through the top surface away from the substrate and TFT circuitry, the emission area can be significantly higher than the conventional bottom-emitting devices. Therefore, much work has been done to produce OLED displays which are top- or surface-emitting. This configuration has potential to improve display performance compared with bottom-emitting OLEDs.

A common problem with OLED displays is sensitivity to water. Typical electronic devices require humidity levels in a range of about 2500 to below 5000 parts per million (ppm) to prevent premature degradation of device performance within a specified operating and/or storage life of the device. Control of the environment to this range of humidity levels within a packaged device is typically achieved by encapsulating the device or by sealing the device and a desiccant within a cover. Desiccants such as, for example, molecular sieve materials, silica gel materials, and materials commonly referred to as Drierite materials, are used to maintain the humidity level within the above range. Particular highly moisture-sensitive electronic devices, for example, organic light-emitting devices (OLED) or panels, require humidity control to levels below about 1000 ppm. This necessitates sealing an OLED display to prevent the incursion of moisture, for instance by a hermetic seal around the outside of an OLED display. However, hermetic sealing is extremely difficult to achieve or expensive to manufacture, while nearly hermetic sealing is often insufficient in such moisture-sensitive devices, which often require the addition of highly active moisture-absorbing materials.

Numerous publications describe methods and/or materials for controlling humidity levels within enclosed or encapsulated electronic devices. Kawami et al., in U.S. Pat. No. 5,882,761, has taught the use of a desiccant layer over the organic layers of an OLED display, between the substrate and the top seal. Kawami et al. teach the use of the following desiccants: alkali metal oxides, alkali earth metal oxides, sulfates, metal halides, and perchlorates. Such materials can be deposited in a predetermined shape by such techniques as vacuum vapor deposition, sputtering, or spin-coating. Boroson et al., in U.S. Pat. No. 6,226,890, disclose the use of a castable blend of the above desiccants with a suitable binder. However, many desiccating agents can be reactive toward the layers and electrodes of OLED devices, and a number of ways have been proposed to keep the desiccating agents from contacting the OLED components. Kawami et al., in the '761 patent, have taught that the drying agent is to be coated on the inside surface of an airtight container. Boroson et al., in the '890 patent, use the castable blend to coat the interior surface of an enclosure. Techniques such as these require additional materials and efforts.

In addition, arrangements described in the above patents may necessitate placing an opaque layer over the top of the organic layers of the device, including the emitting layer. This arrangement is acceptable for bottom-emitting devices, but it cannot be used for a top-emitting OLED display, as the emission of light would be partially or completely blocked.

Tsuruoka et al., in U.S. Patent Application Publication 2003/0110981, have disclosed a series of transparent drying agents which operate by chemisorption and can be used in an OLED display. These are conceived as useful in OLED devices wherein one wishes to allow light emission through a desiccant layer. However, a desiccant—especially a chemisorption desiccant—is designed to change in the presence of moisture. Therefore, it is possible that the properties of the optical path of the device will change during the device lifetime, leading to potential visual changes in the display. This can limit the usefulness of this method.

One potential method of avoiding the above problems in a top-emitting display has been to put a ring of desiccant around the perimeter of the organic layers. This places the desiccant in a very useful position, close to the outer seal of the device, and any moisture passing the outer seal will first encounter the desiccant ring. However, this technique has the undesirable side-effect of increasing the size of the device without providing any added display area, or limiting the amount of desiccant to minimize the added display area. Thus, a top-emitting device using this technique can be significantly larger or contain significantly less desiccant than the equivalent bottom-emitting device. For some applications, this can be unacceptable.

SUMMARY OF THE INVENTION

It is therefore an object of the present invention to prevent moisture contamination of a top-emitting OLED display in a way that does not interfere with the optical path of the device, does not risk contamination or reaction of the display components with desiccant materials, and that does not increase the non-emitting area of the device.

This object is achieved by a method for reducing moisture contamination in a top emitting OLED device comprising:

a) providing a substrate having top and bottom surfaces;

b) forming a top-emitting EL unit over the top surface of the substrate, wherein the EL unit produces light that is not emitted through the substrate;

c) forming first and second protective covers over the top and bottom substrate surfaces, respectively, and thereby defining first and second chambers, respectively;

d) providing moisture-absorbing material in association with the second chamber; and e) providing communication between the first and second chambers whereby moisture in the first or second chambers is absorbed by the moisture-absorbing material.

It is an advantage of this invention that top-emitting OLED displays can be formed without the need of completely hermetic seals. It is a further advantage of this invention that the choice of desiccants for preserving the lifetime of top-emitting OLED displays is not limited by optical properties. It is a further advantage of this invention that the choice of desiccant materials is not limited to materials that remain solid after absorbing water. It is a further advantage of this invention that the absorption of water by desiccants enclosed in a top-emitting OLED display will not change the optical properties of the display. It is a further advantage of this invention that it allows for a top-emitting OLED display with a narrow seal, potentially allowing a top-emitting OLED display to be the same area as a bottom-emitting device. It is a further advantage of this invention that OLED with a large capacity for moisture can be made without increasing the display size to accommodate the desiccant. It is a further advantage of this invention that the desiccants can be used without risk of contact or chemical reaction with the OLED organic layers and/or electrodes. It is a further advantage of some embodiments of this invention that it can be used in techniques for manufacturing simultaneous multiple top-emitting OLED displays.

BRIEF DESCRIPTION OF THE DRAWINGS

FIG. 9b is a cross-sectional view of the above multiple OLED element taken along a section line of FIG. 9a.

Since device feature dimensions such as layer thicknesses are frequently in sub-micrometer ranges, the drawings are scaled for ease of visualization rather than dimensional accuracy.

DETAILED DESCRIPTION OF THE INVENTION

The term "OLED device" or "organic light-emitting display" is used in its art-recognized meaning of a display device comprising organic light-emitting diodes as pixels. A color OLED device emits light of at least one color. The term "multicolor" is employed to describe a display panel that is capable of emitting light of a different hue in different areas. In particular, it is employed to describe a display panel that is capable of displaying images of different colors. These areas are not necessarily contiguous. The term "full color" is commonly employed to describe multicolor display panels that are capable of emitting in the red, green, and blue regions of the visible spectrum and displaying images in any combination of hues. The red, green, and blue colors constitute the three primary colors from which all other colors can be generated by appropriate mixing. However, the use of additional colors to extend the color gamut of the device is possible. The term "hue" refers to the intensity profile of light emission within the visible spectrum, with different hues exhibiting visually discernible differences in color. The term "pixel" is employed in its art-recognized usage to designate an area of a display panel that can be stimulated to emit light independently of other areas. The term "bottom-emitting" refers to display devices that emit light and are viewed through the substrate upon which they are based. The term "top-emitting" refers to display devices in which light is primarily not emitted through the substrate but opposite to the substrate, and are viewed through the side opposite to the substrate.

The term "highly moisture-sensitive electronic device" is employed to designate any electronic device that is susceptible to a measurable degradation of device performance at ambient moisture levels greater than 1000 ppm. The term "substrate" is employed to designate organic, inorganic, or combination organic and inorganic solids on which one or more highly moisture-sensitive electronic devices are fabricated. The term "sealing material" is employed to designate organic, inorganic, or combination organic and inorganic materials used to bond encapsulation enclosures to substrates and to protect one or more highly moisture-sensitive electronic devices from moisture by preventing or limiting moisture permeation through the sealing materials. The term "gap" is employed to designate a discontinuity in the sealing material surrounding one or more electronic devices. The term "moisture-absorbing material" is employed to designate organic or inorganic materials used to physically or chemically absorb or react with moisture that would otherwise damage the highly moisture-sensitive electronic devices.

Figure 1:
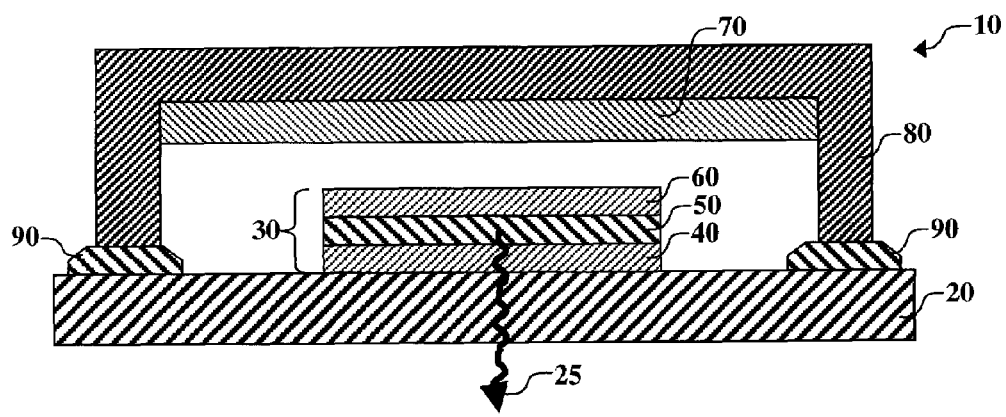
FIG. 1 shows a cross-sectional view of a prior-art apparatus for reducing moisture contamination in an OLED device.

Turning now to FIG. 1, there is shown a prior-art apparatus, as described by Kawami et al. in U.S. Pat. No. 5,882,761, for reducing moisture contamination in an OLED device. In OLED device 10, light-emitting electroluminescent (EL) unit 30, including anode 40, organic layers 50, and cathode 60, is formed on substrate 20. Moisture-absorbing material 70 can be placed in the interior of glass sealing case 80. Moisture-absorbing material 70 and EL unit 30 can be sealed from the exterior by sealing agent 90. OLED device 10 is a bottom-emitting device; that is, light 25 is emitted through substrate 20. Many of the materials used for moisture-absorbing material 70 are opaque. Therefore, this structure is not generally useful for reducing moisture contamination in a top-emitting device.

Figure 2:
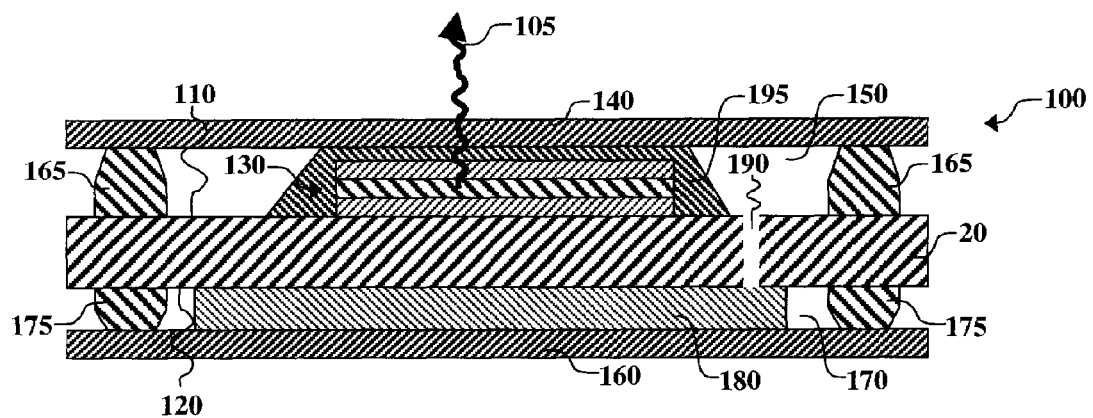
FIG. 2 shows a cross-sectional view of one embodiment of an apparatus that can be used for reducing moisture contamination in a top-emitting OLED device according to this invention.

Turning now to FIG. 2, there is shown one embodiment of an apparatus that can be used for reducing moisture contamination in a top-emitting OLED device according to this invention. Top-emitting OLED device 100 includes substrate 20 with top surface 110 and bottom surface 120. Top-emitting electroluminescent (EL) unit 130 is formed over top surface 110 of substrate 20. EL unit 130 is a highly moisture-sensitive electronic device. EL unit 130 is top-emitting; that is, it will produce light that is emitted through the top of OLED device 100, e.g. light 105. The materials of OLED device 100 are selected so that any light produced in the direction of substrate 20 will be reflected or absorbed, and will not be emitted through substrate 20.

Substrate 20 can be an organic solid, an inorganic solid, or a combination of organic and inorganic solids. Substrate 20 can be rigid or flexible and can be processed as separate individual pieces, such as sheets or wafers, or as a continuous roll. Typical substrate materials include glass, plastic, metal, ceramic, semiconductor, metal oxide, metal nitride, metal sulfide, semiconductor oxide, semiconductor nitride, semiconductor sulfide, carbon, or combinations thereof, or any other materials commonly used in the formation of OLED devices, which can be either passive-matrix devices or active-matrix devices. Substrate 20 can be a homogeneous mixture of materials, a composite of materials, or multiple layers of materials. Substrate 20 can be an OLED substrate, that is a substrate commonly used for preparing OLED devices, e.g. active-matrix low-temperature polysilicon or amorphous-silicon TFT substrate. For this application, where the EL emission is viewed through the top electrode, the transmissive characteristic of the bottom support is immaterial, and therefore can be light transmissive, light absorbing or light reflective.

Substrate 20 includes a means of communication for moisture between substrate top surface 110 and substrate bottom surface 120, e.g. passage 190 through substrate 20. In an alternate embodiment, substrate 20 or a portion thereof can be permeable to moisture either in the vapor form or the liquid form and thereby provide communication; in such case, passage 190 will not be used.

EL unit 130 can optionally be sealed with protection layer 195 before forming a protective cover over top surface 110 of substrate 20. Protection layer 195 can be selected from any number of inorganic or organic materials, or combinations of inorganic and organic materials, provided that the materials have low electrical conductivity, have good heat resistance, and provide good adhesion with the surfaces over which it is applied, and with sealing materials if protection layer 195 is applied over the entire surface of substrate 20. Protection layer 195 protects underlying layers from unwanted chemical reactions or physical changes caused by the high temperatures that are produced during a bonding step that will be further described below. When applied over the entire region to be sealed, protection layer 195 can protect the sensitive OLED unit(s) during handling in subsequent manufacturing steps and from moisture exposure before or after the bonding step.

Some non-limiting examples of protection layer materials include metal oxides such as aluminum oxide; metal nitrides; metal oxynitrides; diamond-like carbon; semiconductor oxides such as silicon dioxide; semiconductor nitrides such as silicon nitride; semiconductor oxynitrides such as silicon oxynitride; multilayer materials such as aluminum oxide/acrylate polymers as provided by Vitex Corp.; polymer layers such as parylene, epoxy, polyester, polyolefins, etc.; organic or organometallic compounds such as aluminum trisoxine (ALQ) or 4,4'-Bis[N-(1-naphthyl)-N-phenylamino]biphenyl (NPB); multiple layers of organic, inorganic, or both organic and inorganic materials; or mixtures of any of these. Protection layer 195 is typically provided in a thickness of ten to several hundreds of nanometers.

Useful techniques of forming layers of protection layer material from a vapor phase include, but are not limited to, thermal physical vapor deposition, sputter deposition, electron beam deposition, chemical vapor deposition, plasma-enhanced chemical vapor deposition, laser-induced chemical vapor deposition, atomic layer deposition, screen printing, and spin coating. In some instances, said materials can be deposited from a solution or another fluidized matrix, e.g., from a supercritical solution of $CO_2$. Care must be taken to choose a solvent or fluid matrix that does not negatively affect the performance of the device. Patterning of the materials can be achieved through many means including, but not limited to, photolithography, lift-off techniques, laser ablation, and shadow mask technology.

First protective cover 140 can be formed over substrate top surface 110. First protective cover 140 can be an organic solid, an inorganic solid, or a combination of organic and inorganic solids. First protective cover 140 can be rigid or flexible and can be processed as separate individual pieces, such as sheets or wafers, or as continuous rolls. Typical protective cover materials include glass, plastic, metal, ceramic, semiconductor, metal oxide, metal nitride, metal sulfide, semiconductor oxide, semiconductor nitride, semiconductor sulfide, carbon or combinations thereof. The portion of first protective cover 140 over top-emitting EL unit 130 is transparent, but portions that cover non-emitting regions of OLED device 100 can be opaque. First protective cover 140 can be a homogeneous mixture of materials, a composite of materials, multiple layers of materials, or an assembly of multiple materials such as a transparent window with an opaque frame.

In addition, first protective cover 140 can include one or more optically active layers for imparting desirable properties to OLED device 100 or to emitted light 105. Examples of useful optically active layers include color filter arrays for limiting the wavelengths of emitted light, color change modules (e.g. fluorescent layers) for converting a range of wavelengths to another range of wavelengths, light-extraction layers for limiting losses due to total internal reflection, anti-reflection layers, and polarizing layers.

Top sealing material 165 surrounds each individual EL unit 130, but the sealing material can also surround groups of two or more EL units if the final product requires more than one EL unit within a single element. In addition, the sealing material surrounding each EL unit 130 or group of EL units contains no gaps, such that EL unit 130 is protected from moisture prior to separating into smaller single or multiple device elements. Top sealing material 165 can be organic, inorganic, or a combination of organic and inorganic. The organic sealing material can include epoxies, polyurethanes, acrylates, silicones, polyamides, polyolefins, and polyesters, or combinations thereof. The inorganic sealing material can include glass, ceramic, metal, semiconductor, metal oxide, semiconductor oxide, and metal solder, or combinations thereof. The sealing material can be bonded between substrate 20 and first protective cover 140 in a bonding step accomplished by pressing, by melting and cooling, by reaction curing, or by a combination thereof. Typical materials bonded by pressure include pressure-sensitive adhesives. Typical materials bonded by melting and cooling include glass; hot melt adhesives such as polyolefins, polyesters, polyamides, or combinations thereof; or inorganic solders such as indium, tin, lead, silver, gold, or combinations thereof. Typical reaction curing methods include reactions resulting from heat, radiation such as UV radiation, mixing of two or more components, exposure to ambient moisture, removal of ambient oxygen, or combinations thereof. Typical materials bonded by reaction curing include acrylates, epoxies, polyurethanes, silicones, or combinations thereof. Other inorganic material typically used in sealing materials include glass, ceramic, metal, semiconductor, metal oxide, semiconductor oxide, or combinations thereof. First protective cover 140, substrate top surface 110, and sealing material 165 (or other enclosing material) between first protective cover 140 and substrate 20 define first chamber 150, which includes top-emitting EL unit 130, and protection layer 195 if used. In some embodiments, the space of chamber 150 can also include a polymer buffer layer, which can be any number of materials, including UV or heat cured epoxy resin, acrylates, or pressure sensitive adhesive. The polymer buffer layer can also function as a protective layer. An example of a useful UV-curable epoxy resin is Optocast 3505 from Electronic Materials Inc. An example of useful pressure sensitive adhesive is Optically Clear Laminating Adhesive 8142 from 3M.

Second protective cover 160 can be formed over substrate bottom surface 120. Second protective cover 160 can include any of the materials described above for first protective cover 140, except that the transparency of second protective cover 160 is immaterial. Bottom sealing material 175 can be chosen from the same materials as top sealing material 165 and is bonded between substrate 20 and second protective cover 160 by choosing among the same techniques as with top sealing material 165. Second protective cover 160, substrate bottom surface 120, and bottom sealing material 175 between protective cover 160 and substrate 20 define second chamber 170. The formation of second chamber 170 and bottom sealing material 175 can occur simultaneously with the formation of first chamber 150 and top sealing material 165, or the two chambers can be formed and sealed sequentially.

Moisture-absorbing material 180, also known as a desiccant, is provided in association with second chamber 170. Moisture-absorbing material 180 is used to physically or chemically absorb or react with moisture that would otherwise damage the highly moisture-sensitive EL unit 130. Typical moisture-absorbing materials include metals such as alkali metals (e.g. Li, Na); alkaline earth metals (e.g. Ba, Ca); or other moisture-reactive metals (e.g. Al, Fe); alkaline metal oxides (e.g. $Li_2O$, $Na_2O$); alkaline earth metal oxides (e.g. MgO, CaO, BaO); sulfates (e.g. anhydrous $MgSO_4$); metal halides (e.g. $CaCl_2$); perchlorates (e.g. $Mg(ClO_4)_2$); molecular sieves; organometallic compounds described by Takahashi et al. in U.S. Pat. No. 6,656,609 and by Tsuruoka et al. in U.S. Patent Application 2003/0110981, including organometallic compounds of the type:

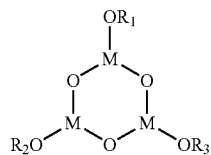

wherein $R_1$, $R_2$, and $R_3$ are selected from the group consisting of alkyl groups, aryl groups, cycloalkyl groups, heterocyclic groups, and acyl groups having one or more carbon atoms, and M is a trivalent metallic atom; organometallic compounds of the type:

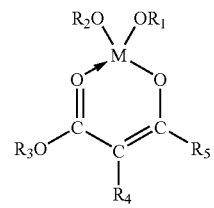

wherein each of $R_1$, $R_2$, $R_3$, $R_4$, and $R_5$ is selected from the group consisting of alkyl groups, alkenyl groups, aryl groups, cycloalkyl groups, heterocyclic groups, and acyl groups having one or more carbon atoms, and M is a trivalent metal atom; organometallic compounds of the type:

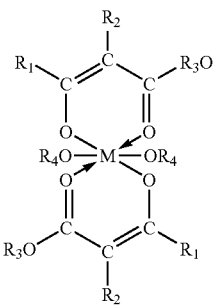

wherein each of $R_1$, $R_2$, $R_3$, and $R_4$ is selected from the group consisting of alkyl groups, alkenyl groups, aryl groups, cycloalkyl groups, heterocyclic groups, and acyl groups having one or more carbon atoms, and M is a tetravalent metal atom; and metals with work functions less than 4.5 eV and capable of being oxidized in the presence of moisture, or combinations thereof. Moisture-absorbing material can be packaged within moisture permeable containers or binders. The moisture-absorbing material can be a single material, a homogeneous mixture of materials, a composite of materials, or multiple layers of materials, and can be deposited from a vapor or from solution, or they can be provided in a porous matrix such as a permeable package or tape. Particularly useful moisture-absorbing materials include those that are provided in a polymeric matrix that can be patterned, as described by Boroson et al. in U.S. Pat. No. 6,226,890. Moisture-absorbing material 180 can be provided on substrate 20, or on or in second protective cover 160. The means of communication provided between first chamber 150 and second chamber 170 (e.g. passage 190, or a moisture-permeable substrate 20) permits moisture in either first chamber 150 or second chamber 170 to be absorbed by moisture-absorbing material 180.

In sealing first and second protective covers 140 and 160 to substrate 20, pressure can build up internally due to gases trapped in the device. This has been recognized by Boroson et al. in U.S. patent application Ser. No. 09/957,851 and U.S. Pat. Nos. 6,470,594, 6594,916 and 6,590,157. Methods described by Boroson et al. to prevent pressure buildup can be applied to this invention.

For example, first protective cover 140 or second protective cover 160 or both can include vent holes for the escape of excess internal gas. If passage 190 is present in substrate 20, it can serve as the vent hole for sealing one of the protective covers, so that only a single protective cover need be equipped with vent holes. After the bonding step, the vent holes are sealed with vent hole seal material. The vent hole seal material can be the same as top sealing material 165 or can be different. Examples of suitable vent hole seal materials are adhesives, solders, tapes, multilayer laminates bonded with adhesive, and inorganic covers bonded with adhesive.

In another embodiment, the sealing material (e.g. top sealing material 165) is so placed to leave one or more gaps between the protective covers and substrate 20. Excess internal gas can exit through the gaps during the bonding step, and the gaps can be sealed after the bonding step. In an alternate embodiment, the size of the gaps is so chosen to allow the gaps to be filled by spreading the sealing material during the bonding step.

In another embodiment, the bonding step starts at a low initial ambient pressure. During the bonding step in which gas pressure can build up inside the device (e.g. in first chamber 150 or second chamber 170), one can increase the ambient pressure above the initial pressure surrounding substrate 20, protective covers 140 and 160, and sealing material 165 and 175. This can reduce the pressure difference between the inside of the device (e.g. chambers 150 and 170, defined by the substrate, protective covers, and sealing material) relative to the increased ambient pressure, to thereby prevent deformation of sealing material 165 and 175.

Figure 3:
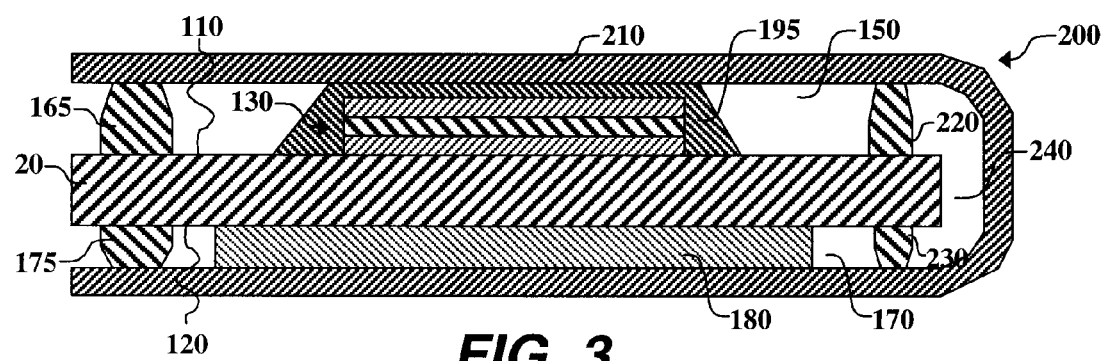
FIG. 3 shows a cross-sectional view of another embodiment of an apparatus that can be used for reducing moisture contamination in a top-emitting OLED device according to this invention.

Turning now to FIG. 3, there is shown another embodiment of an apparatus that can be used for reducing moisture contamination in a top-emitting OLED device according to this invention. Top-emitting OLED device 200 shares many features with OLED device 100 of FIG. 2. However, it is not necessary to include a means of communication that penetrates substrate 20. In OLED device 200, a single protective material 210 that can be folded provides the first and second protective covers and also provides communication between the first and second chambers by forming a passage around at least a part of at least one edge of substrate 20. Alternatively, a single material can be formed into the shape shown in a separate step, or two or more separate pieces can be assembled to form the shape shown. Materials for protective material 210 include those described above for the first protective cover with the additional requirement of flexibility. The folding of protective material 210 forms passage 240. Supports 220 and 230 can include the same material as top sealing material 165 and bottom sealing material 175. However, supports 220 and 230 are not a continuous seal. Gaps between sections of supports 220 and 230 allow passage 240 to communicate with both first chamber 150 and second chamber 170, thereby providing communication between first and second chambers 150 and 170, respectively, whereby moisture in first chamber 150 or in second chamber 170 can be absorbed by moisture-absorbing material 180.

Figure 4:
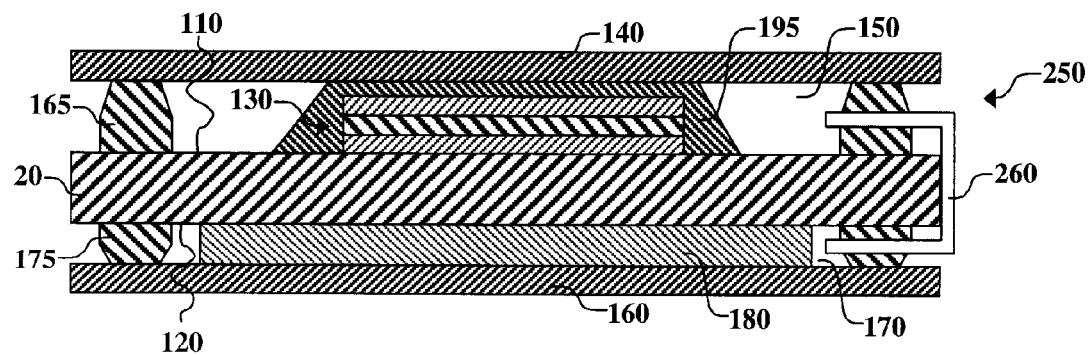
FIG. 4 shows a cross-sectional view of another embodiment of an apparatus that can be used for reducing moisture contamination in a top-emitting OLED device according to this invention.

Turning now to FIG. 4, there is shown another embodiment of an apparatus that can be used for reducing moisture contamination in a top-emitting OLED device according to this invention. Top-emitting OLED device 250 shares many features with OLED device 100 of FIG. 2. However, it is not necessary to include a means of communication that penetrates substrate 20. Before top chamber 150 and bottom chamber 170 are sealed, tube connector 260 is placed in contact with both chambers through top sealing material 165 and bottom sealing material 175, thereby providing communication between first and second chambers 150 and 170, respectively, whereby moisture in first chamber 150 or in second chamber 170 can be absorbed by moisture-absorbing material 180. Alternately, when sealing materials 165 and 175 include gaps to allow the exit of internal gas during the bonding step, tube connector 260 can be placed in the gaps prior to final sealing of the gaps.

Figure 5:
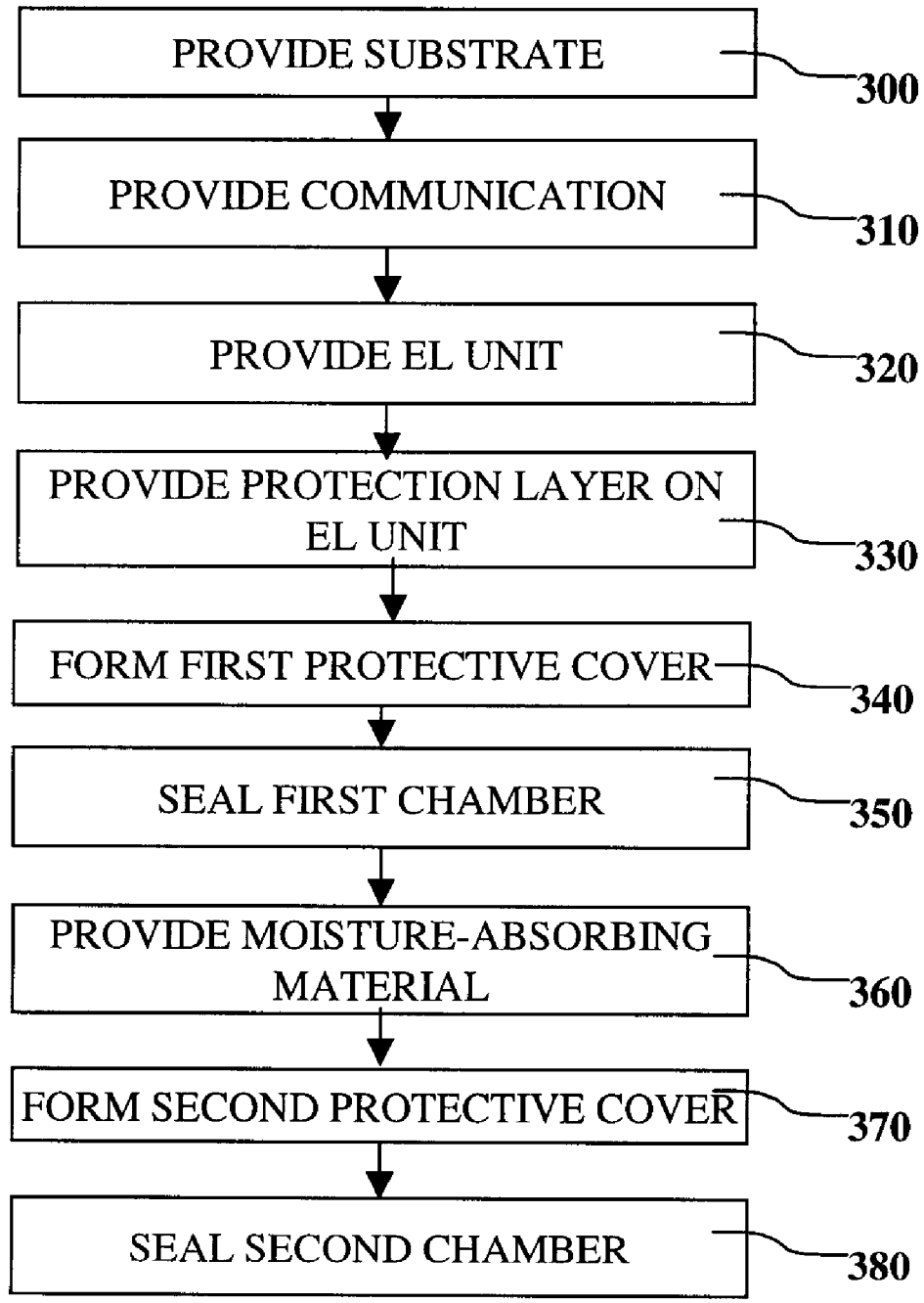
FIG. 5 shows a block diagram of one embodiment of a method for reducing moisture contamination in a top-emitting OLED device according to this invention.

Turning now to FIG. 5, and referring also to FIG. 2, there is shown a block diagram of one embodiment of a method for reducing moisture contamination in a top-emitting OLED device according to this invention. It will be understood that some variation in the order of the steps is possible in this and subsequent procedures while achieving the same results. At the start, substrate 20 is provided (Step 300) and a means of communication (e.g. passage 190) is provided (Step 310). Top-emitting EL unit 130 is provided on substrate top surface 110 (Step 320), and if desired EL unit 130 is sealed with protection layer 195 (Step 330). First protective cover 140 is formed or placed over substrate top surface 110 (Step 340) and sealed with top sealing material 165 to form first chamber 150 (Step 350). Moisture-absorbing material 180 is provided (Step 360) and second protective cover 160 is formed or placed over substrate bottom surface 120 (Step 370). Second chamber 170 is then sealed with bottom-sealing material 175 (Step 380).

Figure 6:
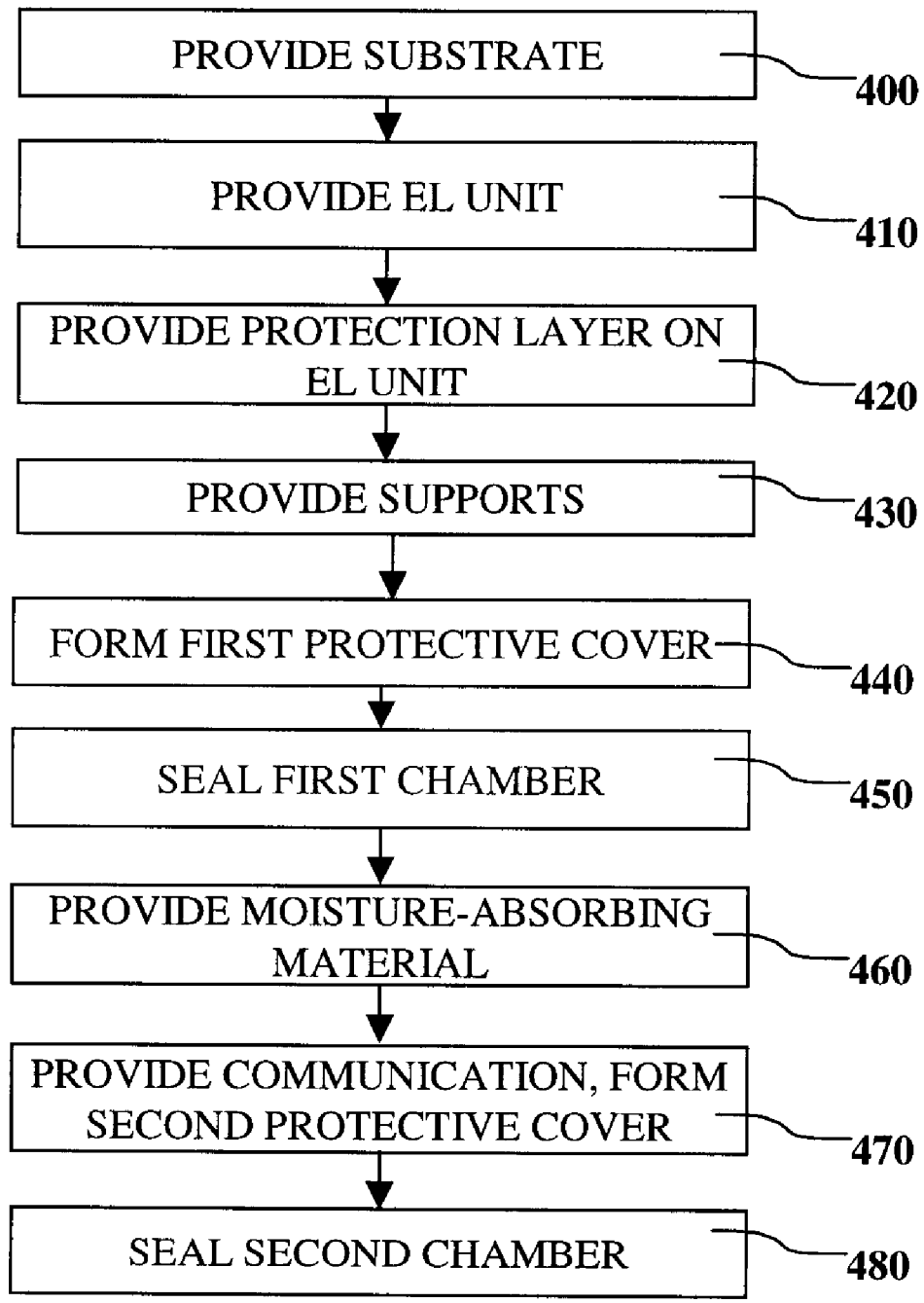
FIG. 6 shows a block diagram of another embodiment of a method for reducing moisture contamination in a top-emitting OLED device according to this invention.

Turning now to FIG. 6, and referring also to FIG. 3, there is shown a block diagram of another embodiment of a method for reducing moisture contamination in a top-emitting OLED device according to this invention. At the start, substrate 20 is provided (Step 400). Top-emitting EL unit 130 is provided on substrate top surface 110 (Step 410), and if desired EL unit 130 is sealed with protection layer 195 (Step 420). Supports 220 and 230 are provided on substrate top and bottom surfaces 110 and 120, respectively. A first protective cover is formed by placing a portion of protective material 210 over substrate top surface 110 (Step 440), and sealed with top sealing material 165 to form first chamber 150 (Step 450). Moisture-absorbing material 180 is provided (Step 460). Protective material 210 is folded over substrate bottom surface 120 to provide communication for moisture via passage 240 and to form the second protective cover over substrate bottom surface 120 (Step 470). Alternatively, protective material 210 is shaped beforehand and positioned over substrate bottom surface 120, or additional parts of protective material 210 are positioned over substrate bottom surface 120. Second chamber 170 is then sealed with bottom-sealing material 175 (Step 480).

Figure 7:
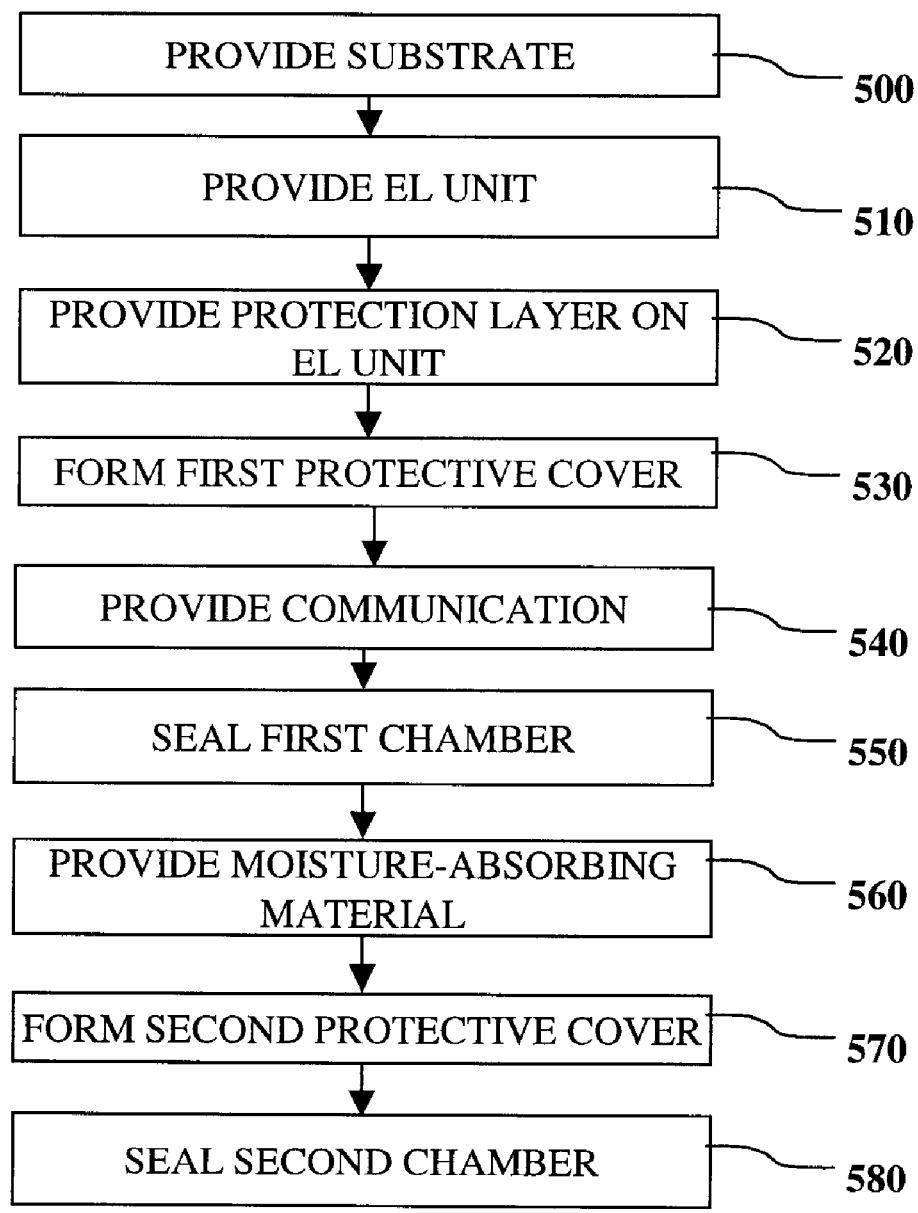
FIG. 7 shows a block diagram of another embodiment of a method for reducing moisture contamination in a top-emitting OLED device according to this invention.

Turning now to FIG. 7, and referring also to FIG. 4, there is shown a block diagram of another embodiment of a method for reducing moisture contamination in a top-emitting OLED device according to this invention. At the start, substrate 20 is provided (Step 500). Top-emitting EL unit 130 is provided on substrate top surface 110 (Step 510), and if desired EL unit 130 is sealed with protection layer 195 (Step 520). First protective cover 140 is formed or placed over substrate top surface 110 (Step 530). Tube connector 260 is placed between incipient first and second chambers 150 and 170 so as to provide communication for moisture (Step 540) and first protective cover 140 is sealed with top sealing material 165 to form first chamber 150 (Step 550). Moisture-absorbing material 180 is provided (Step 560) and second protective cover 160 is formed or placed over substrate bottom surface 120 (Step 570). Second chamber 170 is then sealed with bottom-sealing material 175 (Step 580).

The present invention can be employed in most OLED device configurations. These include very simple structures including a single anode and cathode to more complex devices, including passive matrix displays include of orthogonal arrays of anodes and cathodes to form pixels, and active-matrix displays where each pixel is controlled independently, for example, with thin film transistors (TFTs). OLED devices of this invention can operate under forward biasing and so can function under DC mode. It is sometimes advantageous to apply a reverse bias, e.g. in an alternating mode. The OLED typically does not emit light under reverse bias, but significant stability enhancements have been demonstrated, as described in U.S. Pat. No. 5,552,678.

Figure 8:
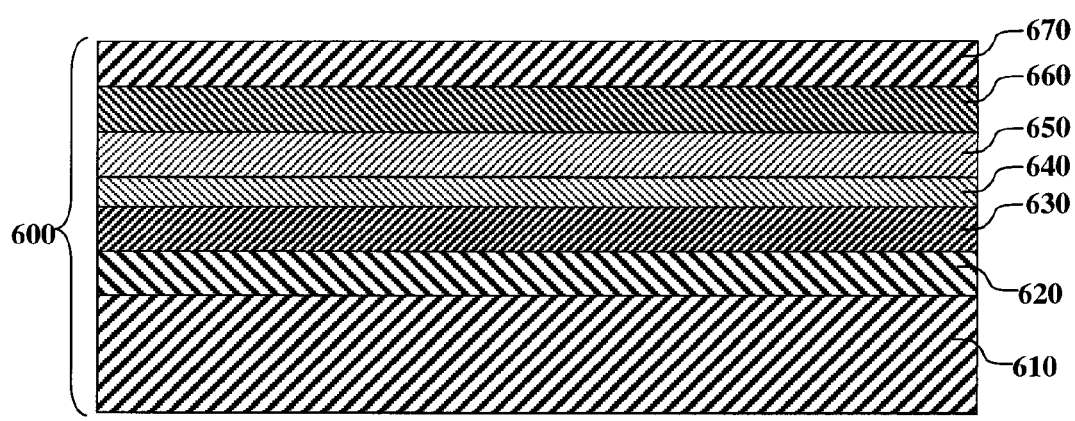
FIG. 8 shows a cross-sectional view of the various layers of a typical OLED device.

Turning now to FIG. 8, there is shown a cross-sectional view of the various layers of a typical top-emitting OLED device 600. OLED device 600 includes at a minimum a substrate 610 as described above, an anode 620, a cathode 670 spaced from anode 620, and a light-emitting layer 650. The device can also include a hole-injecting layer 630, a hole-transporting layer 640, and an electron-transporting layer 660. Hole-injecting layer 630, hole-transporting layer 640, light-emitting layer 650, and electron-transporting layer 660 include organic layers 50 of FIG. 1. These components will be described in more detail.

A bottom-electrode layer is disposed over substrate 610 and is most commonly configured as an anode, as in anode 620. However, the practice of this invention is not limited to this configuration and can instead have a cathode as the bottom-electrode layer. For the purposes of this discussion, the bottom-electrode layer is considered the anode. For a top-emitting device, anode 620 can be transparent, reflective, or opaque to the emission of interest. Common transparent anode materials useful in this invention are indium-tin oxide and tin oxide, but other metal oxides can work including, but not limited to, aluminum- or indium-doped zinc oxide, magnesium-indium oxide, and nickel-tungsten oxide. In addition to these oxides, metal nitrides such as gallium nitride, metal selenides such as zinc selenide, and metal sulfides such as zinc sulfide, can be used as an anode material. Anode materials can include conductive metals, e.g. gold, silver, aluminum, iridium, molybdenum, palladium, platinum, or alloys thereof. The preferred anode materials, transmissive or otherwise, have a work function of 4.1 eV or greater. Desired anode materials can be deposited by any suitable means such as evaporation, sputtering, chemical vapor deposition, or electrochemical means. Anode materials can be patterned using well known photolithographic processes.

While not always necessary, it is often useful that a hole-injecting layer 630 be formed over anode 620 in an organic light-emitting display. The hole-injecting material can serve to improve the film formation property of subsequent organic layers and to facilitate injection of holes into the hole-transporting layer. Suitable materials for use in hole-injecting layer 630 include, but are not limited to, porphyrinic compounds as described in U.S. Pat. No. 4,720,432, plasma-deposited fluorocarbon polymers as described in U.S. Pat. No. 6,208,075, and inorganic oxides including vanadium oxide (VOx), molybdenum oxide (MoOx), nickel oxide (NiOx), etc. Alternative hole-injecting materials reportedly useful in organic EL devices are described in EP 0 891 121 A1 and EP 1 029 909 A1.

While not always necessary, it is often useful that a hole-transporting layer 640 be formed and disposed over anode 620. Desired hole-transporting materials can be deposited by any suitable means such as evaporation, sputtering, chemical vapor deposition, electrochemical means, thermal transfer, or laser thermal transfer from a donor material. Hole-transporting materials useful in hole-transporting layer 640 are well known to include compounds such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. in U.S. Pat. No. 3,180,730. Other suitable triarylamines substituted with one or more vinyl radicals and/or comprising at least one active hydrogen-containing group are disclosed by Brantley et al. in U.S. Pat. Nos. 3,567,450 and 3,658,520.

A more preferred class of aromatic tertiary amines are those which include at least two aromatic tertiary amine moieties as described in U.S. Pat. Nos. 4,720,432 and 5,061,569. Such compounds include those represented by structural Formula A.

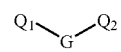

A wherein:

$Q_1$ and $Q_2$ are independently selected aromatic tertiary amine moieties; and G is a linking group such as an arylene, cycloalkylene, or alkylene group of a carbon to carbon bond.

In one embodiment, at least one of Q1 or Q2 contains a polycyclic fused ring structure, e.g., a naphthalene. When G is an aryl group, it is conveniently a phenylene, biphenylene, or naphthalene moiety.

A useful class of triarylamines satisfying structural Formula A and containing two triarylamine moieties is represented by structural Formula B.

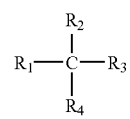

B where:

$R_1$ and $R_2$ each independently represent a hydrogen atom, an aryl group, or an alkyl group or $R_1$ and $R_2$ together represent the atoms completing a cycloalkyl group; and $R_3$ and $R_4$ each independently represent an aryl group, which is in turn substituted with a diaryl substituted amino group, as indicated by structural Formula C.

C wherein $R_5$ and $R_6$ are independently selected aryl groups. In one embodiment, at least one of $R_5$ or $R_6$ contains a polycyclic fused ring structure, e.g., a naphthalene.

Another class of aromatic tertiary amines are the tetraaryldiamines. Desirable tetraaryldiamines include two diarylamino groups, such as indicated by Formula C, linked through an arylene group. Useful tetraaryldiamines include those represented by Formula D.

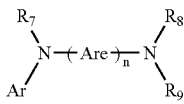

D wherein:
each Are is an independently selected arylene group, such as a phenylene or anthracene moiety;
n is an integer of from 1 to 4; and
Ar, $R_7$, $R_8$, and $R_9$ are independently selected aryl groups.

In a typical embodiment, at least one of Ar, $R_7$, $R_8$, and $R_9$ is a polycyclic fused ring structure, e.g., a naphthalene.

The various alkyl, alkylene, aryl, and arylene moieties of the foregoing structural Formulae A, B, C, D, can each in turn be substituted. Typical substituents include alkyl groups, alkoxy groups, aryl groups, aryloxy groups, and halogens such as fluoride, chloride, and bromide. The various alkyl and alkylene moieties typically contain from 1 to about 6 carbon atoms. The cycloalkyl moieties can contain from 3 to about 10 carbon atoms, but typically contain five, six, or seven carbon atoms—e.g., cyclopentyl, cyclohexyl, and cycloheptyl ring structures. The aryl and arylene moieties are usually phenyl and phenylene moieties.

The hole-transporting layer in an OLED device can be formed of a single or a mixture of aromatic tertiary amine compounds. Specifically, one can employ a triarylamine, such as a triarylamine satisfying the Formula B, in combination with a tetraaryldiamine, such as indicated by Formula D. When a triarylamine is employed in combination with a tetraaryldiamine, the latter is positioned as a layer interposed between the triarylamine and the electron-injecting and transporting layer. Illustrative of useful aromatic tertiary amines are the following:

1,1-Bis(4-di-p-tolylaminophenyl)cyclohexane
1,1-Bis(4-di-p-tolylaminophenyl)-4-phenylcyclohexane
N,N,N',N'-tetraphenyl-4,4'''-diamino-1,1':4',1'':4'',1'''-quaterphenyl
Bis(4-dimethylamino-2-methylphenyl)phenylmethane
1,4-bis[2-[4-[N,N-di(p-tolyl)amino]phenyl]vinyl]benzene (BDTAPVB)
N,N,N',N'-Tetra-p-tolyl-4,4'-diaminobiphenyl
N,N,N',N'-Tetraphenyl-4,4'-diaminobiphenyl
N,N,N',N'-tetra-1-naphthyl-4,4'-diaminobiphenyl
N,N,N',N'-tetra-2-naphthyl-4,4'-diaminobiphenyl
N-Phenylcarbazole
4,4'-Bis[N-(1-naphthyl)-N-phenylamino]biphenyl (NPB)
4,4'-Bis[N-(1-naphthyl)-N-(2-naphthyl)amino]biphenyl (TNB)
4,4'-Bis[N-(1-naphthyl)-N-phenylamino]p-terphenyl
4,4'-Bis[N-(2-naphthyl)-N-phenylamino]biphenyl
4,4'-Bis[N-(3-acenaphthenyl)-N-phenylamino]biphenyl
1,5-Bis[N-(1-naphthyl)-N-phenylamino]naphthalene
4,4'-Bis[N-(9-anthryl)-N-phenylamino]biphenyl
4,4'-Bis[N-(1-anthryl)-N-phenylamino]-p-terphenyl
4,4'-Bis[N-(2-phenanthryl)-N-phenylamino]biphenyl
4,4'-Bis[N-(8-fluoranthenyl)-N-phenylamino]biphenyl
4,4'-Bis[N-(2-pyrenyl)-N-phenylamino]biphenyl
4,4'-Bis[N-(2-naphthacenyl)-N-phenylamino]biphenyl
4,4'-Bis[N-(2-perylenyl)-N-phenylamino]biphenyl
4,4'-Bis[N-(1-coronenyl)-N-phenylamino]biphenyl
2,6-Bis(di-p-tolylamino)naphthalene
2,6-Bis[di-(1-naphthyl)amino]naphthalene
2,6-Bis[N-(1-naphthyl)-N-(2-naphthyl)amino]naphthalene
N,N,N',N'-Tetra(2-naphthyl)-4,4'''-diamino-p-terphenyl
4,4'-Bis{N-phenyl-N-[4-(1-naphthyl)-phenyl]amino}biphenyl
2,6-Bis[N,N-di(2-naphthyl)amino]fluorene
4,4',4''-tris[(3-methylphenyl)phenylamino]triphenylamine (MTDATA)
4,4'-Bis[N-(3-methylphenyl)-N-phenylamino]biphenyl (TPD)

Another class of useful hole-transporting materials includes polycyclic aromatic compounds as described in EP 1 009 041. Some hole-injecting materials described in EP 0 891 121 A1 and EP 1 029 909 A1 can also make useful hole-transporting materials. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

Light-emitting layer 650 produces light in response to hole-electron recombination. A light-emitting layer is commonly disposed over hole-transporting layer 640 in an OLED display. Desired organic light-emitting materials can be deposited by any suitable means such as evaporation, sputtering, chemical vapor deposition, electrochemical means, or radiation thermal transfer from a donor material. Useful organic light-emitting materials are well known. As more fully described in U.S. Pat. Nos. 4,769,292 and 5,935,721, the light-emitting layers of the organic EL element include a luminescent or fluorescent material where electroluminescence is produced as a result of electron-hole pair recombination in this region. A light-emitting layer can be comprised of a single material, but more commonly includes a host doped with a guest compound or dopant where light emission comes primarily from the dopant. The host can include a single host material or a mixture of host materials. The dopant is selected to produce color light having a particular spectrum. The host materials in light-emitting layer 650 can be an electron-transporting material, as defined below, a hole-transporting material, as defined above, or another material that supports hole-electron recombination. The dopant is usually chosen from highly fluorescent dyes, but phosphorescent compounds, e.g., transition metal complexes as described in WO 98/55561, WO 00/18851, WO 00/57676, and WO 00/70655 are also useful. Dopants are typically coated as 0.01 to 10% by weight into the host material.

The host and emitting materials can be small non-polymeric molecules or polymeric materials including polyfluorenes and polyvinylarylenes (e.g., poly(p-phenylenevinylene), PPV). In the case of polymers, small molecule emitting materials can be molecularly dispersed into a polymeric host, or the emitting materials can be added by copolymerizing a minor constituent into a host polymer.

An important relationship for choosing an emitting material is a comparison of the bandgap potential which is defined as the energy difference between the highest occupied molecular orbital and the lowest unoccupied molecular orbital of the molecule. For efficient energy transfer from the host to the emitting material, a necessary condition is that the bandgap of the dopant is smaller than that of the host material. For phosphorescent emitters (including materials that emit from a triplet excited state, i.e., so-called "triplet emitters") it is also important that the triplet energy level of the host be high enough to enable energy transfer from host to emitting material.

Host and emitting molecules known to be of use include, but are not limited to, those disclosed in U.S. Pat. Nos. 4,768,292; 5,141,671; 5,150,006; 5,151,629; 5,294,870;

5,405,709; 5,484,922; 5,593,788; 5,645,948; 5,683,823; 5,755,999; 5,928,802; 5,935,720; 5,935,721; and 6,020,078.

Metal complexes of 8-hydroxyquinoline and similar derivatives (Formula E) constitute one class of useful host materials capable of supporting electroluminescence, and are particularly suitable for light emission of wavelengths longer than 500 nm, e.g., green, yellow, orange, and red.

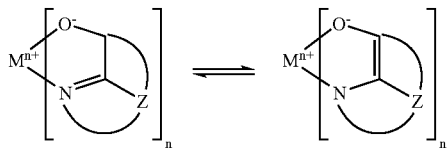

E wherein:

M represents a metal;

n is an integer of from 1 to 3; and

Z independently in each occurrence represents the atoms completing a nucleus having at least two fused aromatic rings.

From the foregoing it is apparent that the metal can be a monovalent, divalent, or trivalent metal. The metal can, for example, be an alkali metal, such as lithium, sodium, or potassium; an alkaline earth metal, such as magnesium or calcium; or an earth metal, such as boron or aluminum. Generally any monovalent, divalent, or trivalent metal known to be a useful chelating metal can be employed.

Z completes a heterocyclic nucleus containing at least two fused aromatic rings, at least one of which is an azole or azine ring. Additional rings, including both aliphatic and aromatic rings, can be fused with the two required rings, if required. To avoid adding molecular bulk without improving on function the number of ring atoms is usually maintained at 18 or less.

Illustrative of useful chelated oxinoid compounds are the following:

CO-1: Aluminum trisoxine [alias, tris(8-quinolinolato)aluminum(III)]

CO-2: Magnesium bisoxine [alias, bis(8-quinolinolato)magnesium(II)]

CO-3: Bis[benzo{f}-8-quinolinolato]zinc (II)

CO-4: Bis(2-methyl-8-quinolinolato)aluminum(III)-μ-oxo-bis(2-methyl-8-quinolinolato)aluminum(III)

CO-5: Indium trisoxine [alias, tris(8-quinolinolato)indium]

CO-6: Aluminum tris(5-methyloxine) [alias, tris(5-methyl-8-quinolinolato)aluminum(III)]

CO-7: Lithium oxine [alias, (8-quinolinolato)lithium(I)]

CO-8: Gallium oxine [alias, tris(8-quinolinolato)gallium (III)]; and

CO-9: Zirconium oxine [alias, tetra(8-quinolinolato)zirconium(IV)].

The host material in one or more of the light-emitting layers of this invention can be an anthracene derivative having hydrocarbon or substituted hydrocarbon substituents at the 9 and 10 positions. For example, derivatives of 9,10-di-(2-naphthyl)anthracene (Formula F) constitute one class of useful host materials capable of supporting electroluminescence, and are particularly suitable for light emission of wavelengths longer than 400 nm, e.g., blue, green, yellow, orange or red.

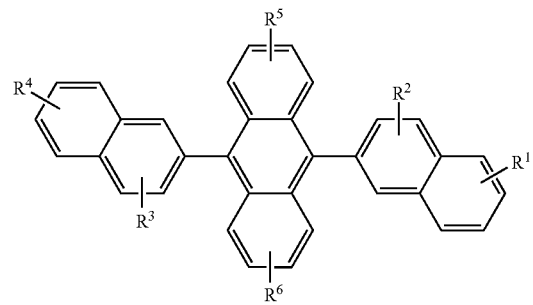

F wherein $R^1$, $R^2$, $R^3$, $R^4$, $R^5$, and $R^6$ represent one or more substituents on each ring where each substituent is individually selected from the following groups:

Group 1: hydrogen, or alkyl of from 1 to 24 carbon atoms;

Group 2: aryl or substituted aryl of from 5 to 20 carbon atoms;

Group 3: carbon atoms from 4 to 24 necessary to complete a fused aromatic ring of anthracenyl, pyrenyl, or perylenyl;

Group 4: heteroaryl or substituted heteroaryl of from 5 to 24 carbon atoms as necessary to complete a fused heteroaromatic ring of furyl, thienyl, pyridyl, quinolinyl or other heterocyclic systems;

Group 5: alkoxylamino, alkylamino, or arylamino of from 1 to 24 carbon atoms; and Group 6: fluorine, chlorine, bromine or cyano.

The monoanthracene derivative of Formula (I) is also a useful host material capable of supporting electroluminescence, and are particularly suitable for light emission of wavelengths longer than 400 nm, e.g., blue, green, yellow, orange or red. Anthracene derivatives of Formula (I) is described in commonly assigned U.S. patent application Ser. No. 10/693,121 filed Oct. 24, 2003 by Lelia Cosimbescu et al., entitled "Electroluminescent Device With Anthracene Derivative Host", the disclosure of which is herein incorporated by reference,

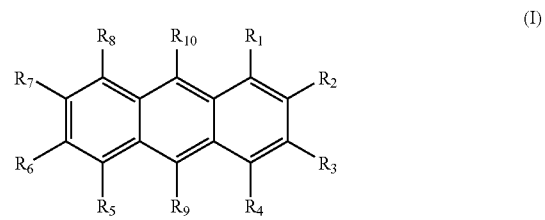

(I)

wherein:

$R_1$-$R_8$ are H; and $R_9$ is a naphthyl group containing no fused rings with aliphatic carbon ring members; provided that $R_9$ and $R_{10}$ are not the same, and are free of amines and sulfur compounds. Suitably, $R_9$ is a substituted naphthyl group with one or more further fused rings such that it forms a fused aromatic ring system, including a phenanthryl, pyrenyl, fluoranthene, perylene, or substituted with one or more substituents including fluorine, cyano group, hydroxy, alkyl, alkoxy, aryloxy, aryl, a heterocyclic oxy group, carboxy, trimethylsilyl group, or an unsubstituted naphthyl group of two fused rings. Conveniently, $R_9$ is 2-naphthyl, or 1-naphthyl substituted or unsubstituted in the para position; and $R_{10}$ is a biphenyl group having no fused rings with aliphatic carbon ring members. Suitably $R_{10}$ is a substituted biphenyl group, such that is forms a fused aromatic ring system including but not limited to a naphthyl, phenanthryl, perylene, or substituted with one or more substituents including fluorine, cyano group, hydroxy, alkyl, alkoxy, aryloxy, aryl, a heterocyclic oxy group, carboxy, trimethylsilyl group, or an unsubstituted biphenyl group. Conveniently, $R_{10}$ is 4-biphenyl, 3-biphenyl unsubstituted or substituted with another phenyl ring without fused rings to form a terphenyl ring system, or 2-biphenyl. Particularly useful is 9-(2-naphthyl)-10-(4-biphenyl)anthracene.

Another useful class of anthracene derivatives is represented by general formula (II):

$$A\,1\text{--}L\text{--}A\,2 \qquad (II)$$

wherein A 1 and A 2 each represent a substituted or unsubstituted monophenylanthryl group or a substituted or unsubstituted diphenylanthryl group and can be the same with or different from each other and L represents a single bond or a divalent linking group.

Another useful class of anthracene derivatives is represented by general formula (III):

$$A\,3\text{--}An\text{--}A\,4 \qquad (III)$$

wherein An represents a substituted or unsubstituted divalent anthracene residue group, A 3 and A 4 each represent a substituted or unsubstituted monovalent condensed aromatic ring group or a substituted or unsubstituted non-condensed ring aryl group having 6 or more carbon atoms and can be the same with or different from each other. Specific examples of useful anthracene materials for use in a light-emitting layer include:

AH1

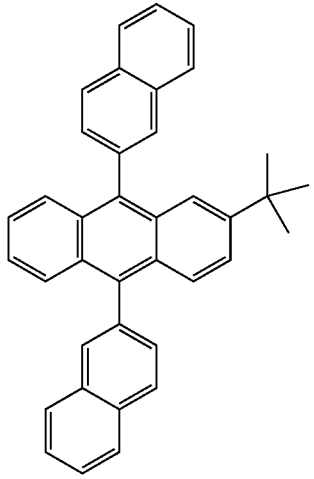

AH2

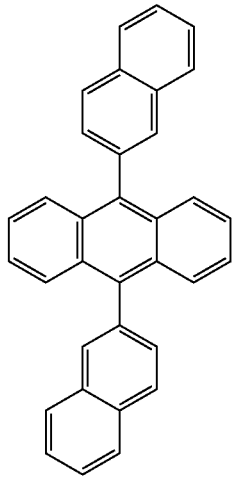

AH3

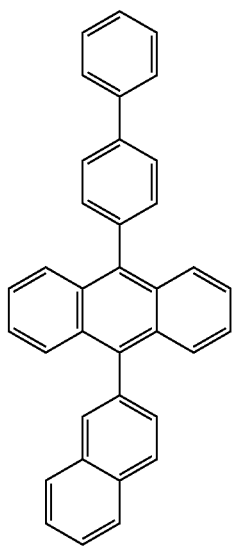

AH4

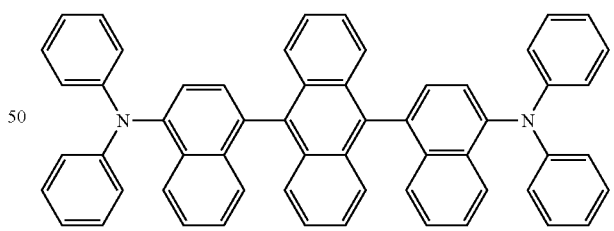

AH5

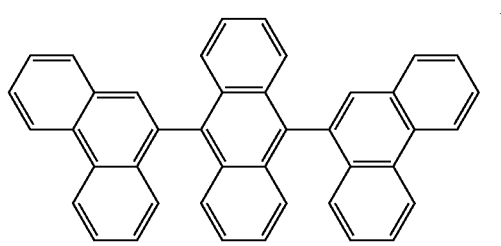

-continued

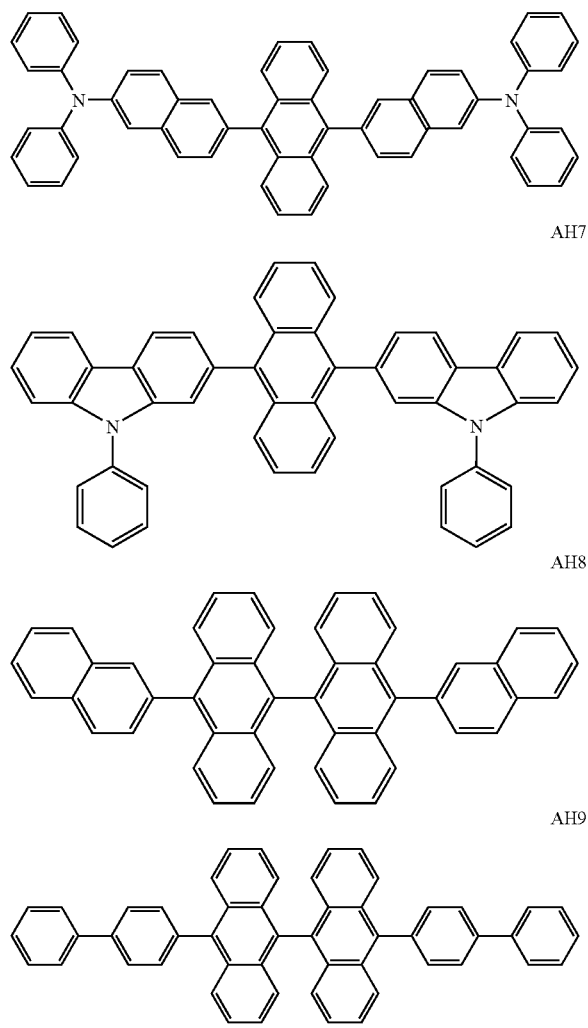

Benzazole derivatives (Formula G) constitute another class of useful host materials capable of supporting electroluminescence, and are particularly suitable for light emission of wavelengths longer than 400 nm, e.g., blue, green, yellow, orange or red.

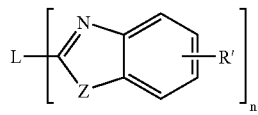

where:
n is an integer of 3 to 8;
Z is O, NR or S;
R' is hydrogen; alkyl of from 1 to 24 carbon atoms, for example, propyl, t-butyl, heptyl, and the like; aryl or heteroatom-substituted aryl of from 5 to 20 carbon atoms for example phenyl, naphthyl, furyl, thienyl, pyridyl, quinolinyl and other heterocyclic systems; or halo such as chloro, fluoro; or atoms necessary to complete a fused aromatic ring; and L is a linkage unit consisting of alkyl, aryl, substituted alkyl, or substituted aryl, which conjugately or unconjugately connects the multiple benzazoles together.

An example of a useful benzazole is 2,2',2"-(1,3,5-phenylene)tris[1-phenyl-1H-benzimidazole].

Certain of the hole-transporting materials described above, e.g. 4,4'-bis[N-(1-naphthyl)-N-phenylamino]biphenyl and 4,4'-bis[N-(2-naphthyl)-N-phenylamino]biphenyl, can also be useful hosts for one or more of the light-emitting layers of this invention.

Suitable host materials for phosphorescent emitters (including materials that emit from a triplet excited state, i.e., so-called "triplet emitters") should be selected so that the triplet exciton can be transferred efficiently from the host material to the phosphorescent material. For this transfer to occur, it is a highly desirable condition that the excited state energy of the phosphorescent material be lower than the difference in energy between the lowest triplet state and the ground state of the host. However, the band gap of the host should not be chosen so large as to cause an unacceptable increase in the drive voltage of the OLED. Suitable host materials are described in WO 00/70655 A2; 01/39234 A2; 01/93642 A1; 02/074015 A2; 02/15645 A1, and U.S. 2002/0117662. Suitable hosts include certain aryl amines, triazoles, indoles and carbazole compounds. Examples of desirable hosts are 4,4'-N,N'-dicarbazole-biphenyl (CBP), 2,2'-dimethyl-4,4'-(N,N'-dicarbazole)biphenyl, m-(N,N'-dicarbazole)benzene, and poly(N-vinylcarbazole), including their derivatives.

Desirable host materials are capable of forming a continuous film. The light-emitting layer can contain more than one host material in order to improve the device's film morphology, electrical properties, light emission efficiency, and lifetime. The light-emitting layer can contain a first host material that has good hole-transporting properties, and a second host material that has good electron-transporting properties.

Desirable fluorescent dopants for OLED displays commonly include perylene or derivatives of perylene, derivatives of anthracene, tetracene, xanthene, rubrene, coumarin, rhodamine, quinacridone, dicyanomethylenepyran compounds, thiopyran compounds, polymethine compounds, pyrilium and thiapyrilium compounds, derivatives of distryrylbenzene or distyrylbiphenyl, bis(azinyl)methane boron complex compounds, and carbostyryl compounds. Illustrative examples of dopants include, but are not limited to, the following:

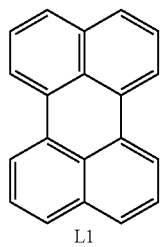

L1

-continued
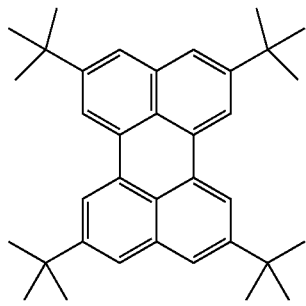
L2
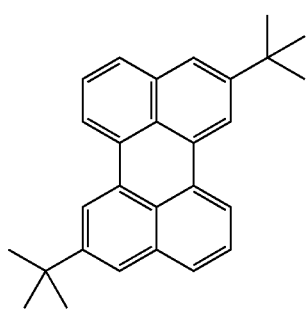
L3
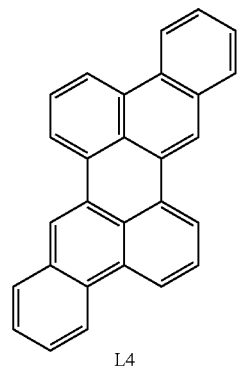
L4
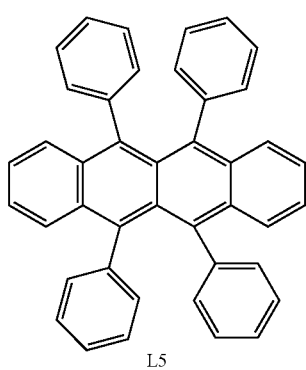
L5
-continued
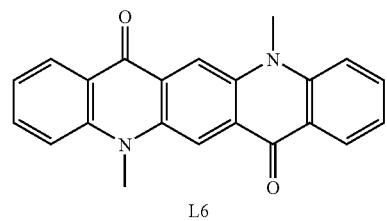
L6
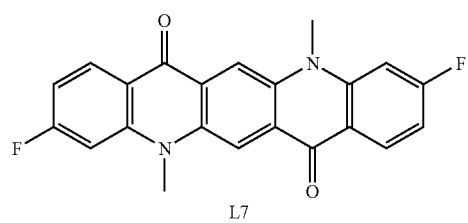
L7
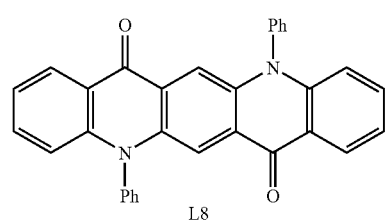
L8
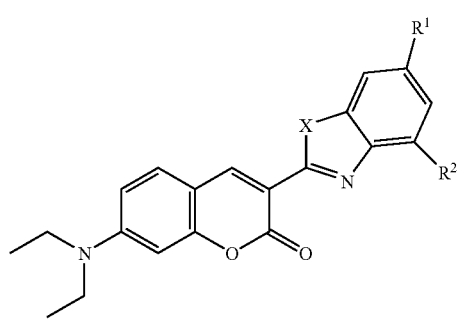
|     | X | R1     | R2     |
| --- | - | ------ | ------ |
| L9  | O | H      | H      |
| L10 | O | H      | Methyl |
| L11 | O | Methyl | H      |
| L12 | O | Methyl | Methyl |
| L13 | O | H      | t-butyl |
| L14 | O | t-butyl | H     |
| L15 | O | t-butyl | t-butyl |
| L16 | S | H      | H      |
| L17 | S | H      | Methyl |
| L18 | S | Methyl | H      |
| L19 | S | Methyl | Methyl |
| L20 | S | H      | t-butyl |
| L21 | S | t-butyl | H     |
| L22 | S | t-butyl | t-butyl |

-continued
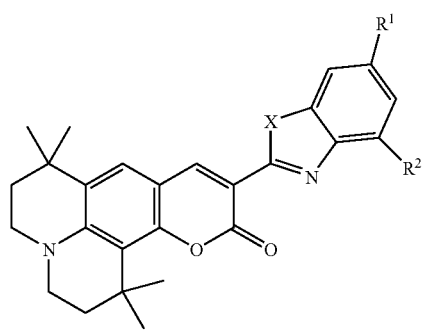
|     | X | R1     | R2     |
|-----|---|--------|--------|
| L23 | O | H      | H      |
| L24 | O | H      | Methyl |
| L25 | O | Methyl | H      |
| L26 | O | Methyl | Methyl |
| L27 | O | H      | t-butyl|
| L28 | O | t-butyl| H      |
| L29 | O | t-butyl| t-butyl|
| L30 | S | H      | H      |
| L31 | S | H      | Methyl |
| L32 | S | Methyl | H      |
| L33 | S | Methyl | Methyl |
| L34 | S | H      | t-butyl|
| L35 | S | t-butyl| H      |
| L36 | S | t-butyl| t-butyl|
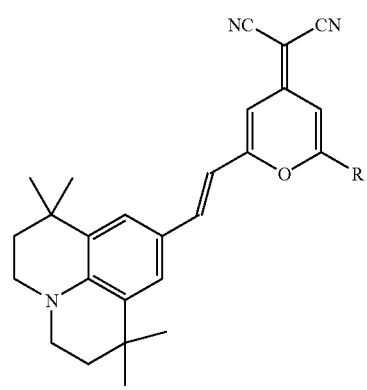
|     | R       |
|-----|---------|
| L37 | phenyl  |
| L38 | methyl  |
| L39 | t-butyl |
| L40 | mesityl |
-continued
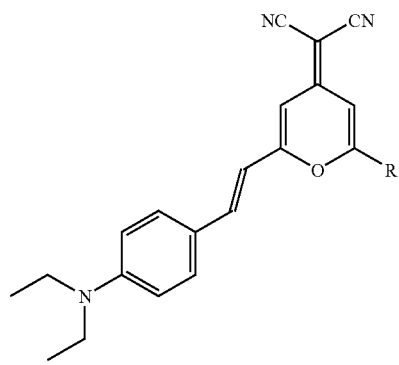
|     | R       |
|-----|---------|
| L41 | phenyl  |
| L42 | methyl  |
| L43 | t-butyl |
| L44 | mesityl |
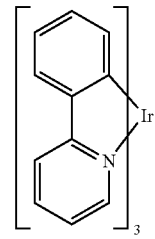
L45
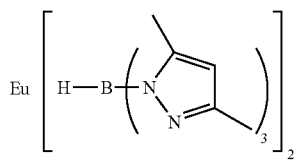

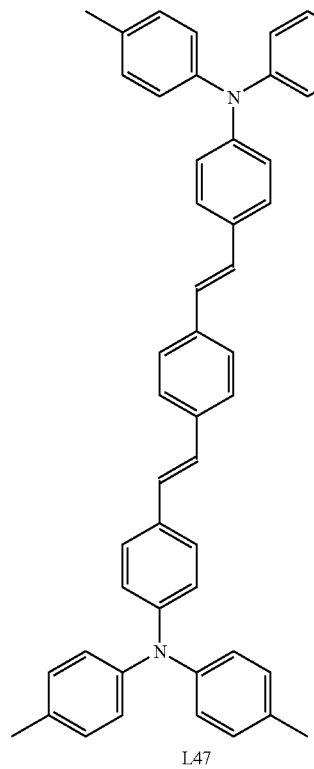
L47
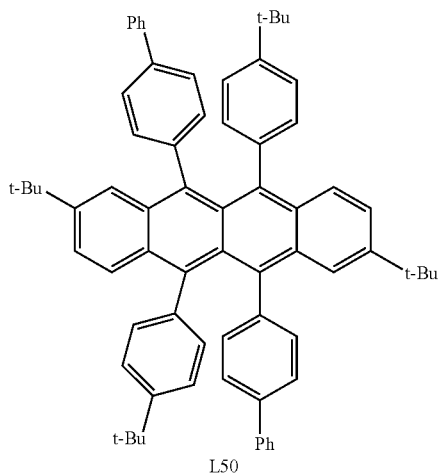
L50
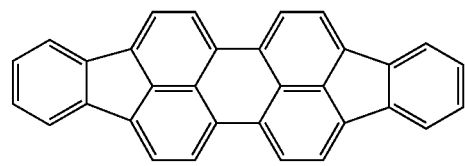
L51
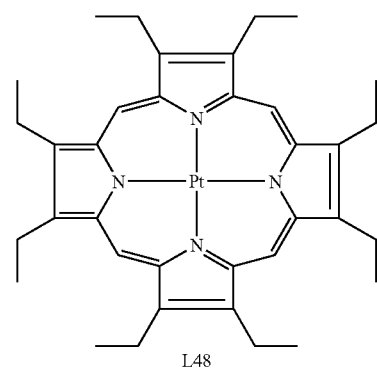
L48
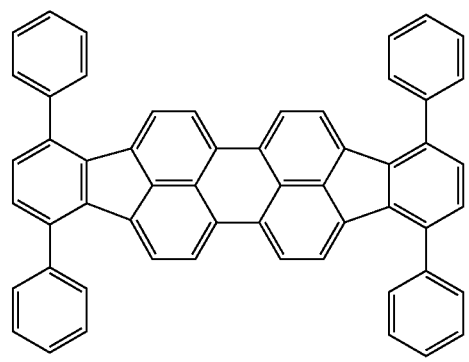
L52
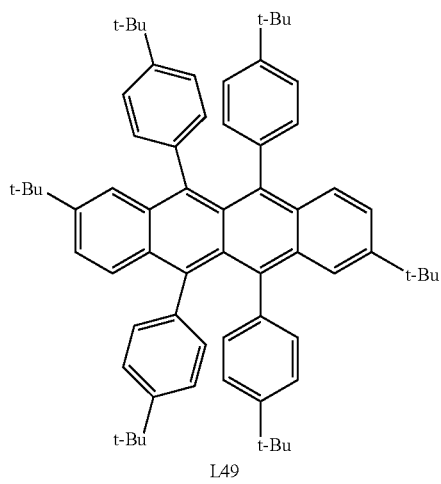
L49
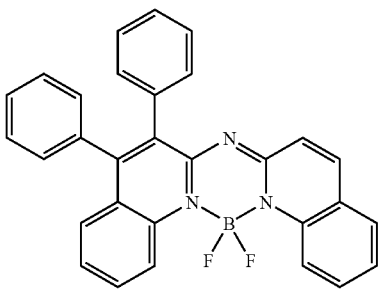
L53

-continued

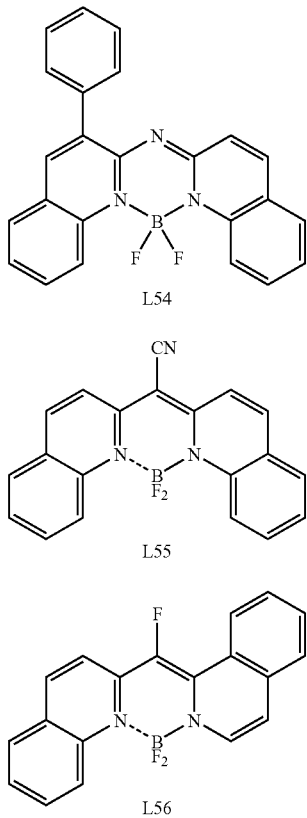

L54

L55

L56

Other organic emissive materials can be polymeric substances, e.g. polyphenylenevinylene derivatives, dialkoxy-polyphenylenevinylenes, poly-para-phenylene derivatives, and polyfluorene derivatives, as taught by Wolk et al. in commonly assigned U.S. Pat. No. 6,194,119 B1 and references cited therein.

Examples of useful phosphorescent materials that can be used in light-emitting layers of this invention include, but are not limited to, those described in WO 00/57676, WO 00/70655, WO 01/41512 A1, WO 02/15645 A1, U.S. 2003/0017361 A1, WO 01/93642 A1, WO 01/39234 A2, U.S. Pat. No. 6,458,475 B1, WO 02/071813 A1, U.S. Pat. No. 6,573,651 B2, U.S. 2002/0197511 A1, WO 02/074015 A2, U.S. Pat. No. 6,451,455 B1, U.S. 2003/0072964 A1, U.S. 2003/0068528 A1, U.S. Pat. No. 6,413,656 B1, U.S. Pat. No. 6,515,298 B2, U.S. Pat. No. 6,451,415 B1, U.S. Pat. No. 6,097,147, U.S. 2003/0124381 A1, U.S. 2003/0059646 A1, U.S. 2003/0054198 A1, EP 1 239 526 A2, EP 1 238 981 A2, EP 1 244 155 A2, U.S. 2002/0100906 A1, U.S. 2003/0068526 A1, U.S. 2003/0068535 A1, JP 2003/073387A, JP 2003/073388A, U.S. 2003/0141809 A1, U.S. 2003/0040627 A1, JP 2003/059667A, JP 2003/073665A, and U.S. 2002/0121638 A1.

The emission wavelengths of cyclometallated Ir(III) complexes of the type IrL$_3$ and IrL$_2$L', such as the green-emitting fac-tris(2-phenylpyridinato-N,C$^{2'}$)iridium(III) and bis(2-phenylpyridinato-N,C$^{2'}$)iridium(III)(acetylacetonate) can be shifted by substitution of electron donating or withdrawing groups at appropriate positions on the cyclometallating ligand L, or by choice of different heterocycles for the cyclometallating ligand L. The emission wavelengths can also be shifted by choice of the ancillary ligand L'. Examples of red emitters are the bis(2-(2'-benzothienyl)pyridinato-N, C$^{3'}$)iridium(III)(acetylacetonate) and tris(1-phenylisoquinolinato-N,C)iridium(III). A blue-emitting example is bis(2-(4,6-diflourophenyl)-pyridinato-N,C$^{2'}$)iridium(III) (picolinate).

Red electrophosphorescence has been reported, using bis(2-(2'-benzo[4,5-a]thienyl)pyridinato-N,C$^{3'}$) iridium (acetylacetonate) [Btp$_2$Ir(acac)] as the phosphorescent material (Adachi, C., Lamansky, S., Baldo, M. A., Kwong, R. C., Thompson, M. E., and Forrest, S. R., *App. Phys. Lett.*, 78, 1622-1624 (2001)).

Still other examples of useful phosphorescent materials include coordination complexes of the trivalent lanthanides such as Tb$^{3+}$ and Eu$^{3+}$ (J. Kido et al, *Appl. Phys. Lett.*, 65, 2124 (1994)).

In addition to suitable hosts, an OLED device employing a phosphorescent material often requires at least one exciton- or hole-blocking layer to help confine the excitons or electron-hole recombination centers to the light-emitting layer comprising the host and phosphorescent material. In one embodiment, such a blocking layer would be placed between a phosphorescent light-emitting layer and the cathode, and in contact with the phosphorescent light-emitting layer. In this case, the ionization potential of the blocking layer should be such that there is an energy barrier for hole migration from the host into the electron-transporting layer (or the metal-doped organic layer), while the electron affinity should be such that electrons pass more readily from the electron-transporting layer (or the metal-doped organic layer) into the light-emitting layer comprising host and phosphorescent material. It is further desired, but not absolutely required, that the triplet energy of the blocking material be greater than that of the phosphorescent material. Suitable hole-blocking materials are described in WO 00/70655A2 and WO 01/93642 A1. Two examples of useful materials are bathocuproine (BCP) and bis(2-methyl-8-quinolinolato)(4-phenylphenolato)aluminum(III) (BAlQ). Metal complexes other than Balq are also known to block holes and excitons as described in U.S. 2003/0068528. U.S. 2003/0175553 A1 describes the use of fac-tris(1-phenylpyrazolato-N,C$^{2'}$)iridium(III) (Irppz) in an electron/exciton blocking layer.

While not always necessary, it is often useful that OLED device 600 includes an electron-transporting layer 660 disposed over light-emitting layer 650. Desired electron-transporting materials can be deposited by any suitable means such as evaporation, sputtering, chemical vapor deposition, electrochemical means, thermal transfer, or laser thermal transfer from a donor material. Preferred electron-transporting materials for use in electron-transporting layer 660 are metal chelated oxinoid compounds, including chelates of oxine itself (also commonly referred to as 8-quinolinol or 8-hydroxyquinoline). Such compounds help to inject and transport electrons and exhibit both high levels of performance and are readily fabricated in the form of thin films. Exemplary of contemplated oxinoid compounds are those satisfying structural Formula E, previously described.

Other electron-transporting materials include various butadiene derivatives as disclosed in U.S. Pat. No. 4,356,429 and various heterocyclic optical brighteners as described in U.S. Pat. No. 4,539,507. Benzazoles satisfying structural Formula G are also useful electron-transporting materials. Related materials, denoted collectively as BAlq, can also be used as electron transporting materials. Bryan et al., in U.S. Pat. No. 5,141,671, discuss such materials. The BAlq compounds are mixed-ligand aluminum chelates, specifically bis(R$_s$-8-quinolinolato)(phenolato)aluminum(III) chelates, where R$_s$ is a ring substituent of the 8-quinolinolato ring nucleus. These compounds are represented by the formula $(R_sQ)_2AlOL$, where Q represents a substituted 8-quinolinolato ligand, $R_s$ represents an 8-quinolinolato ring substituent to block sterically the attachment of more than two substituted 8-quinolinolato ligands to the aluminum ion, OL is phenolato ligand, O is oxygen, and L is phenyl or a hydrocarbon-substituted phenyl moiety of from 6 to 24 carbon atoms. These materials also make good hole- or exciton-blocking layers for use with triplet emitting materials, as is known in the art.

Other electron-transporting materials can be polymeric substances, e.g. polyphenylenevinylene derivatives, poly-para-phenylene derivatives, polyfluorene derivatives, polythiophenes, polyacetylenes, and other conductive polymeric organic materials such as those listed in *Handbook of Conductive Molecules and Polymers*, Vols. 1-4, H. S. Nalwa, ed., John Wiley and Sons, Chichester (1997).

It will be understood that, as is common in the art, some of the layers can have more than one function. For example, light-emitting layer 650 can have hole-transporting properties or electron-transporting properties as desired for performance of the OLED device. Hole-transporting layer 640 or electron-transporting layer 660, or both, can also have emitting properties. In such a case, fewer layers than described above can be sufficient for the desired emissive properties, so long as three layers have the light-emitting qualities as described herein.

The organic EL media materials mentioned above are suitably deposited through a vapor-phase method including sublimation, sputtering, chemical vapor deposition, and thermal transfer from a donor element. Organic EL media materials can alternatively be deposited from a fluid, for example, from a solvent with an optional binder to improve film formation. Deposition from a fluid can be done in many ways including, but not limited to, ink-jet, spin coating, curtain coating, spray coating, and electrochemical deposition. If the material is a polymer, solvent deposition is usually preferred, but other methods can be used, including sputtering, electrochemical deposition, electrophoretic deposition or thermal transfer from a donor sheet. The material to be deposited by sublimation can be vaporized from a sublimation "boat" often comprised of a tantalum material, e.g., as described in U.S. Pat. No. 6,237,529, or can be first coated onto a donor sheet and then sublimed in closer proximity to the substrate. Layers with a mixture of materials can utilize separate sublimation boats or the materials can be premixed and coated from a single boat or donor sheet.

Though not shown, an electron-injecting layer can also be present between the cathode and the electron-transporting layer. Examples of electron-injecting materials include alkaline or alkaline earth metals, alkali halide salts, such as LiF mentioned above, or alkaline or alkaline earth metal doped organic layers.

A top-electrode layer is spaced from the bottom electrode layer. The top-electrode layer is most commonly configured as cathode 670 and is formed over the electron-transporting layer 660 or over light-emitting layer 650 if an electron-transporting layer is not used. In a top-emitting device, the top-electrode layer must be a transparent or semitransparent top-electrode layer. For such applications, metals must be thin or one must use transparent conductive oxides, or a combination of these materials. Optically transparent cathodes have been described in more detail in U.S. Pat. No. 5,776,623. If only transparent cathode materials are used, a separate semitransparent structure is required to reflect a portion of the light. Cathode materials can be deposited by evaporation, sputtering, or chemical vapor deposition. When needed, patterning can be achieved through many well known methods including, but not limited to, through-mask deposition, integral shadow masking as described in U.S. Pat. No. 5,276,380 and EP 0 732 868, laser ablation, and selective chemical vapor deposition.

Cathode 670 can be part of an active matrix display and in that case is a single electrode for the entire display. Alternatively, cathode 670 can be part of a passive matrix display, in which each cathode 670 can activate a column of pixels, and cathodes 670 are arranged orthogonal to anodes 620.

Cathode materials can be deposited by evaporation, sputtering, or chemical vapor deposition. When needed, patterning can be achieved through many well known methods including, but not limited to, through-mask deposition, integral shadow masking as described in U.S. Pat. No. 5,276,380 and EP 0 732 868, laser ablation, and selective chemical vapor deposition.

Figure 9A:
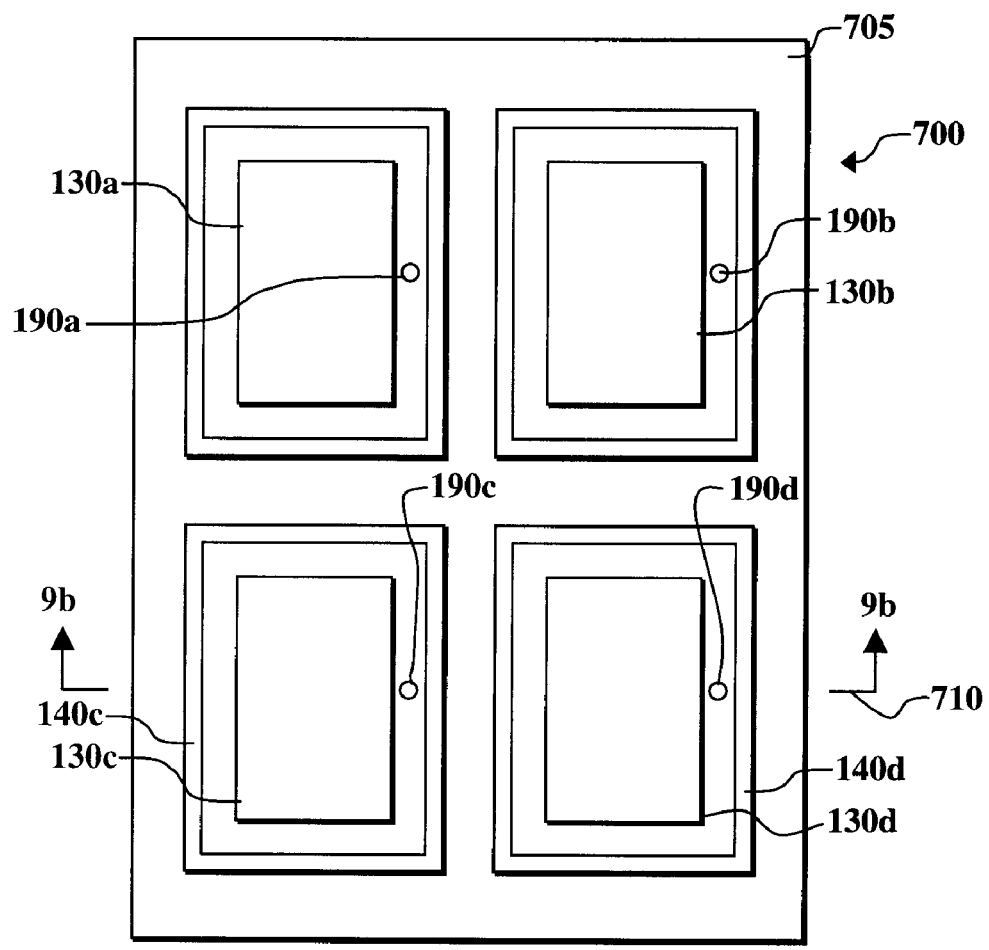
FIG. 9a shows a multiple OLED element to which this invention can be applied.

Turning now to FIG. 9a, there is shown a multiple-OLED element 700 to which this invention can be applied. Two or more top-emitting EL units, e.g. EL units 130a-d, are formed over the top surface of substrate 705. EL units 130a-d are top-emitting, that is they produce light that is not emitted through substrate 700. The units are fabricated together, but each EL unit will form an individual device similar to that described above, with a first and second protective cover over the top and bottom surfaces of the substrate, respectively, a first and second chamber, and moisture-absorbing material in association with each second chamber. Each EL unit will also have a means of communication between the respective first and second chambers, e.g. passages 190a-d.

Figure 9B:
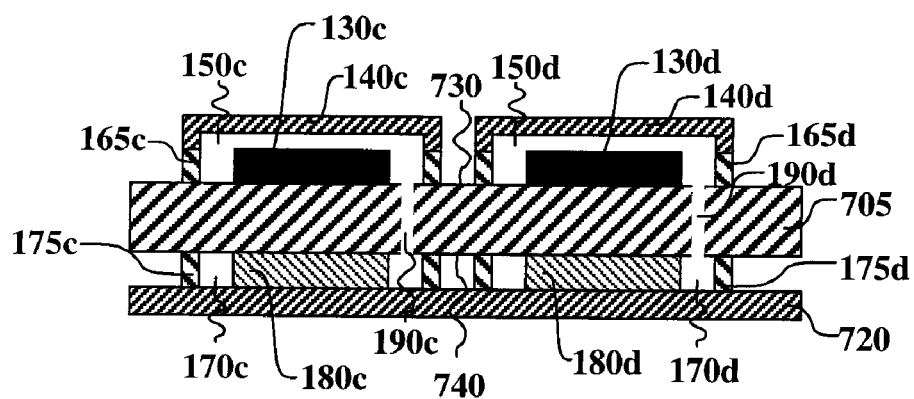

FIG. 9b is a cross-sectional view of the above multiple-OLED element taken along section line 710 of FIG. 9a. EL units, e.g. 130c and 130d, are formed over top surface 730 of substrate 705. A protective layer as already described (not shown) can optionally be provided over the EL units prior to forming one or more protective covers. First protective covers 140c and 140d are formed over top surface 730 of substrate 705. First protective covers 140c and 140d are sealed by top sealing material 165c and 165d, respectively, defining first chambers 150c and 150d. Moisture-absorbing material 180c and 180d is placed against substrate 705 as described herein, and a single second protective cover 720 is placed over the bottom surface 740 of substrate 705 and sealed, e.g. by bottom sealing material 175c and 175d, defining second chambers 170c and 170d. A method for sealing such multiple-OLED elements has been described by Boroson et al. in U.S. Pat. Nos. 6,470,594 and 6,544,916.

It will be understood that either the first or the second protective cover can be a single protective cover (e.g. protective cover 720) or can be two or more protective covers (e.g. protective covers 140c and 140d). Through sealing, the first protective cover(s) will form two or more first chambers, and the second protective cover(s) will form two or more second chambers. Moisture-absorbing material will be associated with each second chamber.

After the first and second protective covers are sealed, multiple-OLED element 700 can be separated into individual top-emitting OLED devices or groups of top-emitting OLED devices. Each device or group of devices will have a portion of initial substrate 705. Boroson et al. have described separating multiple OLED devices.

Communication will be provided between the respective first and second chambers of each EL unit (e.g. first chamber 150c and second chamber 170c) whereby moisture in the first or second chamber will be absorbed by the moisture-absorbing material (e.g. moisture-absorbing material 180c). Communication can be provided by many of the methods already described. For example, a passage similar to passage 190 of FIG. 2 can be provided. In such a case, substrate 705 will include at least one passage for each EL unit. Alternatively, substrate 705 or a portion thereof can be permeable to moisture either in the vapor form or in the liquid form. Alternatively, a structure such as tube connector 260 in FIG. 4 can provide communication. A tube connector can be provided as follows: 1) The first and second protective covers are sealed around each EL unit such that a gap remains in the seals around each unit; 2) The devices are separated into individual units as already described; 3) For each separated EL unit, a tube connector is placed in the gaps in the top sealing material and the bottom sealing material; and 4) The gaps are sealed.

The invention has been described in detail with particular reference to certain preferred embodiments thereof, but it will be understood that variations and modifications can be effected within the spirit and scope of the invention.

PARTS LIST

- 10 OLED device
- 20 substrate
- 25 light
- 30 EL unit
- 40 anode
- 50 organic layers
- 60 cathode
- 70 moisture-absorbing material
- 80 glass sealing case
- 90 sealing agent
- 100 top-emitting OLED device
- 105 light
- 110 substrate top surface
- 120 substrate bottom surface
- 130 top-emitting EL unit
- 130a top-emitting EL unit
- 130b top-emitting EL unit
- 130c top-emitting EL unit
- 130d top-emitting EL unit
- 140 first protective cover
- 140c first protective cover
- 140d first protective cover
- 150 first chamber
- 150c first chamber
- 150d first chamber
- 160 second protective cover
- 165 top sealing material
- 165c top sealing material
- 165d top sealing material
- 170 second chamber
- 170c second chamber
- 170d second chamber
- 175 bottom sealing material
- 175c bottom sealing material
- 175d bottom sealing material
- 180 moisture-absorbing material
- 180c moisture-absorbing material
- 180d moisture-absorbing material
- 190 passage
- 190a passage
- 190b passage
- 190c passage
- 190d passage
- 195 protection layer
- 200 top-emitting OLED device
- 210 protective material
- 220 support
- 230 support
- 240 passage
- 250 top-emitting OLED device
- 260 tube connector
- 300 block
- 310 block
- 320 block
- 330 block
- 340 block
- 350 block
- 360 block
- 370 block
- 380 block
- 400 block
- 410 block
- 420 block
- 430 block
- 440 block
- 450 block
- 460 block
- 470 block
- 480 block
- 500 block
- 510 block
- 520 block
- 530 block
- 540 block
- 550 block
- 560 block
- 570 block
- 580 block
- 600 OLED device
- 610 substrate
- 620 anode
- 630 hole-injecting layer
- 640 hole-transporting layer
- 650 light-emitting layer
- 660 electron-transporting layer
- 670 cathode
- 700 multiple OLED element
- 705 substrate
- 710 section line
- 720 second protective layer
- 730 substrate top surface
- 740 substrate bottom surface

The invention claimed is:

1. A method for reducing moisture contamination in a top-emitting OLED device comprising:
   a) providing a substrate having top and bottom surfaces;
   b) forming a top-emitting EL unit over the top surface of the substrate, wherein the EL unit produces light that is primarily not emitted through the substrate;
   c) forming first and second protective covers over the top and bottom surfaces of the substrate, respectively, and thereby defining first and second chambers, respectively;
   d) providing moisture-absorbing material in association with the second chamber; and
   e) providing communication between the first and second chambers whereby moisture in the first and second chambers is absorbed by the moisture-absorbing material.

2. The method of claim 1 wherein the communication between the first and second chambers is provided by forming a passage through the substrate.

3. The method of claim 1 wherein the communication between the first and second chambers is provided by forming a passage around at least a part of at least one edge of the substrate.

4. The method of claim 1 wherein a single protective material that can be folded provides the first and second protective covers and also provides the communication between the first and second chambers.

5. The method of claim 1 wherein the substrate or a portion thereof is permeable to moisture either in the vapor form or in the liquid form and thereby provides the communication between the first and second chambers.

6. The method of claim 1 wherein a tube connector provides the communication between the first and second chambers.

7. The method of claim 1 wherein the moisture-absorbing material is selected from the group consisting of alkali metals; alkaline earth metals; other moisture-reactive metals: alkaline metal oxides; alkaline earth metal oxides; sulfates; metal halides; perchlorates: molecular sieves; organometallic compounds of the type:

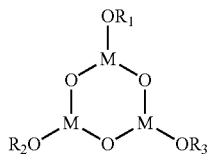

wherein $R_1$, $R_2$, and $R_3$ are selected from the group consisting of alkyl groups, aryl groups, cycloalkyl groups, heterocyclic groups, and acyl groups having one or more carbon atoms, and M is a trivalent metallic atom; organomnetallic compounds of the type:

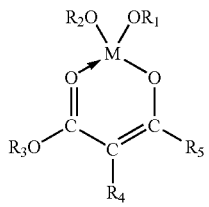

wherein each of $R_1$, $R_2$, $R_3$, $R_4$, and $R_5$ is selected from the group consisting of alkyl groups, alkenyl groups, aryl groups, cycloalkyl groups, heterocyclic groups, and acyl groups having one or more carbon atoms, and M is a trivalent metal atom; organometallic compounds of the type:

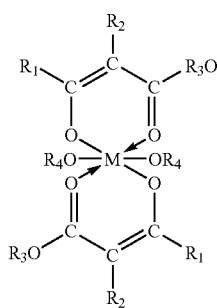

wherein each of $R_1$, $R_2$, $R_3$, and $R_4$ is selected from the group consisting of alkyl groups, alkenyl groups, aryl groups, cycloalkyl groups, heterocyclic groups, and acyl groups having one or more carbon atoms, and M is a tetravalent metal atom; and metals with work functions less than 4.5 eV and capable of being oxidized in the presence of moisture, or combinations thereof.

8. The method of claim 7 wherein the moisture-absorbing material is provided on or in the second protective cover.

9. The method of claim 7 wherein the moisture-absorbing material is provided on the substrate.

10. The method of claim 1 further including providing a protection layer on the EL unit prior to forming the first protective cover over the top surface of the substrate.

11. The method of claim 10 wherein the protection layer is provided over the entire sealed region.

12. The method of claim 10 wherein the protection layer contains a metal oxide, a metal nitride, a metal oxynitride, diamond-like carbon, semiconductor oxide, semiconductor nitride, or semiconductor oxynitride.

13. The method of claim 10 wherein the protection layer contains an organic compound.

14. The method of claim 12 wherein the protection layer contains aluminum oxide, silicon dioxide, silicon nitride, or silicon oxynitride.

15. The method of claim 10 wherein the protection layer contains multiple layers of organic, inorganic, or both organic and inorganic materials.

16. The method of claim 10 wherein the protection layer is provided by thermal physical vapor deposition, sputter deposition, electron beam deposition, chemical vapor deposition, plasma-enhanced chemical vapor deposition, laser-induced chemical vapor deposition, atomic layer deposition, spin coating, screen printing, or dispersing.

17. The method of claim 1 wherein the substrate includes rigid or flexible: glass, plastic, metal, ceramic, semiconductor, metal oxide, metal nitride, metal sulfide, semiconductor oxide, semiconductor nitride, semiconductor sulfide, carbon, or combinations thereof.

18. The method of claim 1 wherein the protective covers include rigid or flexible: glass, plastic, metal, ceramic, semiconductor, metal oxide, metal nitride, metal sulfide, semiconductor oxide, semiconductor nitride, semiconductor sulfide, carbon, or combinations thereof.

19. The method of claim 1 wherein the first protective cover includes one or more additional optically active layers.

20. The method of claim 19 wherein the one or more optically active layers includes a color filter array.

21. The method of claim 19 wherein the one or more optically active layers includes a color change module.

22. The method of claim 19 wherein the one or more optically active layers includes an anti-reflection layer.

23. The method of claim 19 wherein the one or more optically active layers includes a polarizing layer.

24. The method of claim 19 wherein the one or more optically active layers includes a light-extraction layer.

25. The method of claim 1 wherein a sealing material or other enclosing material between the protective covers and the substrate define a portion of the chambers.

26. The method of claim 25 wherein the sealing material is organic or a combination of organic and inorganic.

27. The method of claim 26 wherein the organic sealing material is selected from the group consisting of epoxies, polyurethanes, acrylates, silicones, polyamides, polyolefins, and polyesters, or combinations thereof.

28. The method of claim 25 wherein the sealing material is selected from the group consisting of glass, ceramic, metal, semiconductor, metal oxide, semiconductor oxide, and metal solder, or combinations thereof.

29. The method of claim 25 wherein the sealing material is bonded between the protective cover and the substrate and wherein the bonding step is accomplished by pressing, melting and cooling, reaction curing, or a combination thereof.

30. The method of claim 29 wherein the reaction includes reactions resulting from heat, radiation, mixing of two or more components, exposure to ambient moisture, removal of ambient oxygen, or combinations thereof.

31. The method of claim 29 wherein the first or second protective cover or both include vent holes that are sealed with vent hole seal material after the bonding step.

32. The method of claim 29 wherein the sealing material is so placed to leave one or more gaps between the substrate and one or both protective covers such that excess gas exits through the gaps, and wherein the gaps are sealed after the bonding step.

33. The method of claim 29 wherein the sealing material is so placed to leave one or more gaps between the substrate and one or both protective covers such that excess gas exits through the gaps until the gaps are filled by spreading the sealing material.

34. The method of claim 29 wherein during the bonding step the ambient pressure is increased above the initial pressure surrounding the substrate, the protective covers, and the sealing material, to reduce the pressure difference within spaces defined between the substrate, the protective covers, and the sealing material relative to the increased ambient pressure, to thereby prevent deformation of the scaling material.

35. A method for reducing moisture contamination in top-emitting OLED devices comprising:
   a) providing a substrate having top and bottom surfaces;
   b) forming two or more top-emitting EL units over the top surface of the substrate, wherein each EL unit produces light that is primarily not emitted through the substrate;
   c) forming one or more first and one or more second protective covers over the top and bottom surfaces of the substrate, respectively, and thereby defining two or more first and two or more second chambers, respectively;
   d) providing moisture-absorbing material in association with each second chamber; and
   e) providing communication between the respective first and second chambers of each EL unit whereby moisture in the first and second chambers is absorbed by the moisture-absorbing material.

36. The method of claim 35 wherein a single first protective cover is formed over the top substrate surface.

37. The method of claim 35 wherein two or more first protective covers are formed over the top substrate surface.

38. The method of claim 35 wherein a single second protective cover is formed over the bottom substrate surface.

39. The method of claim 35 wherein two or more second protective covers are formed over the bottom substrate surface.

40. The method of claim 35 further including the step of separating the top-emitting OLED devices into individual devices or groups of devices having a portion of the initial substrate.

41. The method of claim 35 wherein the communication between the first and second chambers is provided by forming passages through the substrate.

42. The method of claim 35 wherein the communication between the first and second chambers is provided by forming passages around at least a part of at least one edge of the substrate.

43. The method of claim 35 wherein the substrate is permeable to moisture either in the vapor form or in the liquid form and thereby provides the communication between the first and second chambers.

44. The method of claim 35 wherein tube connectors provide the communication between the first and second chambers.

45. The method of claim 35 wherein the moisture-absorbing material is selected from the group consisting of alkali metals; alkaline earth metals; other moisture-reactive metals; alkaline metal oxides; alkaline earth metal oxides; sulfates; metal halides; perchlorates; molecular sieves: organometallic compounds of the type:

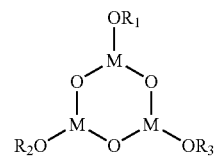

wherein $R_1$, $R_2$, and $R_3$ are selected from the group consisting of alkyl groups, aryl groups, cycloalkyl groups, heterocyclic groups, and acyl groups having one or more carbon atoms, and M is a trivalent metallic atom; organometallic compounds of the type:

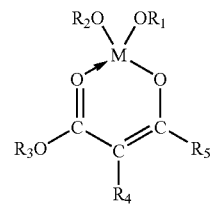

wherein each of $R_1$, $R_2$, $R_3$, $R_4$, and $R_5$ is selected from the group consisting of alkyl groups, alkenyl groups, aryl groups, cycloalkyl groups, heterocyclic groups, and acyl groups having one or more carbon atoms, and M is a trivalent metal atom; organometallic compounds of the type:

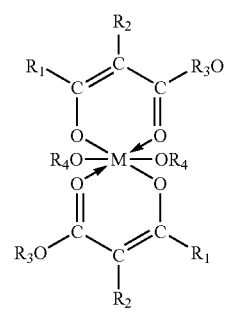

wherein each of $R_1$, $R_2$, $R_3$, and $R_4$ is selected from the group consisting of alkyl groups, alkenyl groups, aryl groups, cycloalkyl groups, heterocyclic groups, and acyl groups having one or more carbon atoms, and M is a tetravalent metal atom; and metals with work functions less than 4.5 cV and capable of being oxidized in the presence of moisture, or combinations thereof.

46. The method of claim 45 wherein the moisture-absorbing material is provided on or in the second protective cover.

47. The method of claim 45 wherein the moisture-absorbing material is provided on the substrate.

48. The method of claim 35 further including providing a protection layer on the EL units prior to forming the first protective cover over the top surface of the substrate.

49. The method of claim 48 wherein the protection layer is provided over the entire sealed region.

50. The method of claim 48 wherein the protection layer contains a metal oxide, a metal nitride, a metal oxynitride, diamond-like carbon, semiconductor oxide, semiconductor nitride, or semiconductor oxynitride.

51. The method of claim 48 wherein the protection layer contains an organic compound.

52. The method of claim 50 wherein the protection layer is aluminum oxide, silicon dioxide, silicon nitride, or silicon oxynitride.

53. The method of claim 48 wherein the protection layer contains multiple layers of organic, inorganic, or both organic and inorganic materials.

54. The method of claim 48 wherein the protection layer is provided by thermal physical vapor deposition, sputter deposition, electron beam deposition, chemical vapor deposition, plasma-enhanced chemical vapor deposition, laser-induced chemical vapor deposition, atomic layer deposition, spin coating, screen printing, or dispersing.

55. The method of claim 35 wherein the substrate includes rigid or flexible: glass, plastic, metal, ceramic, semiconductor, metal oxide, metal nitride, metal sulfide, semiconductor oxide, semiconductor nitride, semiconductor sulfide, carbon, or combinations thereof.

56. The method of claim 35 wherein the protective covers include rigid or flexible: glass, plastic, metal, ceramic, semiconductor, metal oxide, metal nitride, metal sulfide, semiconductor oxide, semiconductor nitride, semiconductor sulfide, carbon, or combinations thereof.

57. The method of claim 35 wherein the first protective cover includes one or more additional optically active layers.

58. The method of claim 57 wherein the one or more optically active layers includes a color filter array.

59. The method of claim 57 wherein the one or more optically active layers includes a color change module.

60. The method of claim 57 wherein the one or more optically active layers includes an anti-reflection layer.

61. The method of claim 57 wherein the one or more optically active layers includes a polarizing layer.

62. The method of claim 57 wherein the one or more optically active layers includes a light-extraction layer.

63. The method of claim 35 wherein a sealing material or other enclosing material between the protective covers and the substrate define a portion of the chambers.

64. The method of claim 63 wherein the sealing material is organic or a combination of organic and inorganic.

65. The method of claim 64 wherein the organic sealing material is selected from the group consisting of epoxies, polyurethanes, acrylates, silicones, polyamides, polyolefins, and polyesters, or combinations thereof.

66. The method of claim 63 wherein the sealing material is selected from the group consisting of glass, ceramic, metal, semiconductor, metal oxide, semiconductor oxide, and metal solder, or combinations thereof.

67. The method of claim 63 wherein the sealing material is bonded between the protective cover and the substrate and wherein the bonding step is accomplished by pressing, melting and cooling, reaction curing, or a combination thereof.

68. The method of claim 67 wherein the reaction includes reactions resulting from heat, radiation, mixing of two or more components, exposure to ambient moisture, removal of ambient oxygen, or combinations thereof.

69. The method of claim 67 wherein the first or second protective cover or both include vent holes that are sealed with vent hole seal material after the bonding step.

70. The method of claim 67 wherein the sealing material is so placed to leave one or more gaps between the substrate and one or both protective and wherein the gaps are sealed after the bonding step.

71. The method of claim 67 wherein the sealing material is so placed to leave one or more gaps between the substrate and one or both protective covers such that excess ambient gas exits through the gaps until the gaps are filled by spreading the sealing material.

72. The method of claim 67 wherein during the bonding step the ambient pressure is increased above the initial pressure surrounding the substrate, the protective covers, and the sealing material, to reduce the pressure difference within spaces defined between the substrate, the protective covers, and the scaling material relative to the increased ambient pressure, to thereby prevent deformation of the sealing material.

* * * * *